(12) United States Patent
Kinoshita

(10) Patent No.: US 12,027,617 B2
(45) Date of Patent: Jul. 2, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 435 days.

(21) Appl. No.: 17/515,645

(22) Filed: Nov. 1, 2021

(65) Prior Publication Data

US 2022/0199824 A1 Jun. 23, 2022

(30) Foreign Application Priority Data

Dec. 18, 2020 (JP) .................. 2020-209898

(51) Int. Cl.
*H01L 29/78* (2006.01)
*H01L 21/76* (2006.01)
(Continued)

(52) U.S. Cl.
CPC ...... *H01L 29/7811* (2013.01); *H01L 21/7602* (2013.01); *H01L 21/761* (2013.01);
(Continued)

(58) Field of Classification Search
CPC ............. H01L 29/7811; H01L 29/1095; H01L 29/1608; H01L 29/66068; H01L 29/7813
See application file for complete search history.

(56) References Cited

U.S. PATENT DOCUMENTS

2003/0067033 A1 4/2003 Kinoshita et al.
2007/0246791 A1* 10/2007 Schulze .............. H01L 29/0615
257/E29.066
(Continued)

FOREIGN PATENT DOCUMENTS

JP 3708057 B2 10/2005
JP 2012-195519 A 10/2012
(Continued)

*Primary Examiner* — Suberr L Chi
(74) *Attorney, Agent, or Firm* — Rabin & Berdo, P.C.

(57) ABSTRACT

A voltage withstanding structure disposed in an edge termination region is a spatial modulation junction termination extension (JTE) structure formed by a combination of a JTE structure and a field limiting ring (FLR) structure. All FLRs configuring the FLR structure are surrounded by an innermost one of $p^{--}$-type regions configuring the JTE structure. An innermost one of the FLRs is disposed overlapping a $p^+$-type extension and the innermost one of the $p^{--}$-type regions, at a position overlapping a border between the $p^+$-type extension and the innermost one of the $p^{--}$-type regions. The FLRs are formed concurrently with $p^{++}$-type contact regions in an active region and have an impurity concentration substantially equal to an impurity concentration of the $p^{++}$-type contact regions. An $n^+$-type channel stopper region is formed concurrently with $n^+$-type source regions in the active region and has an impurity concentration substantially equal to an impurity concentration the $n^+$-type source regions.

10 Claims, 16 Drawing Sheets

(51) Int. Cl.
  *H01L 21/761* (2006.01)
  *H01L 29/06* (2006.01)
  *H01L 29/10* (2006.01)
  *H01L 29/16* (2006.01)
  *H01L 29/66* (2006.01)
(52) U.S. Cl.
  CPC ........ *H01L 29/0623* (2013.01); *H01L 29/063* (2013.01); *H01L 29/1095* (2013.01); *H01L 29/1608* (2013.01); *H01L 29/66068* (2013.01); *H01L 29/7813* (2013.01)

(56) References Cited

U.S. PATENT DOCUMENTS

| | | | |
|---|---|---|---|
| 2017/0179235 A1 | 6/2017 | Kinoshita | |
| 2019/0393312 A1* | 12/2019 | Tawara | ............... H01L 29/0661 |

FOREIGN PATENT DOCUMENTS

| | | | |
|---|---|---|---|
| JP | 5827020 B2 | 12/2015 | |
| JP | 6672764 B2 | 3/2020 | |

\* cited by examiner

FIG.12

| FLR WIDTH | STRUCTURE NAME | NO. OF FLRs | $d_0$ | $d_{n+1} - d_n$ | JTE REGION WIDTH | MINIMUM BREAKDOWN VOLTAGE | JUDGMENT |
|---|---|---|---|---|---|---|---|
| FIRST SETTING CONDITIONS 1μm | SMJTE+Ring(4) | 4 | 3.0μm | 3.0μm | 10μm | 1485V | × |
| | SMJTE+Ring(6) | 6 | 1.5μm | 1.5μm | 10μm | 1538V | △ |
| | SMJTE+Ring(8) | 8 | 1.0μm | 0.5μm | 10μm | 1571V | ○ |
| | SMJTE+Ring(10) | 10 | 1.0μm | 0.2μm | 11μm | 1576V | ○ |
| SECOND SETTING CONDITIONS 1.5μm | SMJTE+Ring(4) | 4 | 2.0μm | 2.5μm | 11μm | 1514V | △ |
| | SMJTE+Ring(6) | 6 | 1.0μm | 1.0μm | 10μm | 1569V | ○ |
| | SMJTE+Ring(8) | 8 | 1.0μm | 0.35μm | 10.2μm | 1583V | ○ |
| | SMJTE+Ring(10) | 10 | 1.0μm | 0.1μm | 10.5μm | 1520V | △ |
| THIRD SETTING CONDITIONS 2μm | SMJTE+Ring(4) | 4 | 2.0μm | 2.5μm | 9μm | 1533V | △ |
| | SMJTE+Ring(6) | 6 | 1.0μm | 0.8μm | 10μm | 1574V | ○ |
| | SMJTE+Ring(8) | 8 | 1.0μm | 0.2μm | 10.4μm | 1538V | ○ |
| | SMJTE+Ring(9) | 9 | 1.0μm | 0.1μm | 9.4μm | 1404V | × |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2020-209898, filed on Dec. 18, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

In an edge termination region between an active region and ends of a semiconductor substrate (semiconductor chip), a voltage withstanding structure of a power semiconductor device is configured by multiple p-type regions selectively provided in a surface region of an n-type drift region exposed at a front surface of a semiconductor substrate. In an instance in which a semiconductor material of a power semiconductor device is silicon carbide (SiC) having a critical electric field strength that is at least one order of magnitude greater than that of silicon (Si), predominantly, a multizone junction termination extension (JTE) structure, a spatial modulation JTE structure, or a field limiting ring (FLR) structure is disposed as a voltage withstanding structure.

The multizone JTE structure is a structure in which at least three p-type regions (hereinafter, JTE regions) are disposed adjacent to one another, concentrically surrounding a periphery of the active region so that the JTE regions are disposed in descending order of impurity concentration from an inner side (active region (center portion of a semiconductor chip: chip center) side), toward an outer side (end of semiconductor substrate (chip end)). Electric field strength tends to decrease with increasing distance from the active region toward the chip end and therefore, in the multizone JTE structure, according to the tendency of electric field distribution, the JTE regions are disposed in descending order of impurity concentration from the active region toward the chip end, whereby a predetermined breakdown voltage based on impurity distribution is stably ensured.

The spatial modulation JTE structure is an improved JTE structure, a structure in which a spatial modulation region is disposed between adjacent JTE regions (in an instance of configuration by only one JTE region, the one JTE region and an n$^-$-type drift region adjacent thereto and closer to the chip end than is the one JTE region); the spatial modulation region has an impurity concentration distribution spatially equivalent to the impurity concentration between these two regions; and an impurity concentration distribution of the entire JTE structure gradually decreases toward the chip end. On both sides of the spatial modulation region are adjacent regions and the spatial modulation region is formed by two small regions each having an impurity concentration that is substantially equal to an impurity concentration of the regions on the sides of the spatial modulation region, the two small regions being disposed adjacent to and repeatedly alternating one another in a predetermined pattern. Spatial impurity concentration distribution of an entire area of the spatial modulation region is determined by widths and an impurity concentration ratio of the two small regions.

The spatial modulation JTE structure is capable of ensuring a predetermined breakdown voltage more stably as compared to a general JTE structure without the spatial modulation region. The FLR structure is a structure in which multiple p-type regions (FLRs) of a same impurity concentration are disposed apart from one another surrounding a periphery of the active region, concentrically. In the FLR structure, due to the multiple p-type regions disposed apart from one another, electric field is distributed, ensuring a predetermined breakdown voltage. In this manner, a predetermined voltage withstanding structure is disposed in the edge termination region and electric field of the edge termination region is mitigated or distributed, whereby the breakdown voltage of the edge termination region is enhanced, thereby enhancing the breakdown voltage of the entire semiconductor device. A structure of a conventional silicon carbide semiconductor device is described.

FIG. 19 is a cross-sectional view depicting a structure of a conventional silicon carbide semiconductor device. A conventional silicon carbide semiconductor device 110 in FIG. 19 is a vertical metal oxide semiconductor field effect transistor (MOSFET) having a double-zone spatial modulation JTE structure 130 in an edge termination region 102 of a semiconductor substrate (semiconductor chip) 140 containing silicon carbide, the vertical MOSFET having a trench gate structure including insulated gates (MOS gates) having a three-layered structure including a metal, an oxide film and a semiconductor. The edge termination region 102 surrounds a periphery of an active region 101 through which a main current of the MOSFET flows.

In the semiconductor substrate 140, silicon carbide layers 142, 143 constituting an n$^-$-type drift region 112 and a p-type base region 113 are sequentially formed by epitaxial growth on an n$^+$-type starting substrate 111 containing silicon carbide. A portion of the p-type silicon carbide layer 143 in the edge termination region 102 is removed by etching, thereby forming a drop 124 at a front surface of the semiconductor substrate 140. The front surface of the semiconductor substrate 140 has a second portion 140b that is bordered by the drop 124 and recessed toward a drain electrode 125, the second portion 140b being closer to the chip end (ends of the semiconductor substrate 140) than is a first portion 140a that is relatively closer to the chip center (center of the semiconductor substrate 140).

Due to the drop 124, the p-type silicon carbide layer 143 is left in a mesa shape in a center of the front surface (main surface having the p-type silicon carbide layer 143) of the semiconductor substrate 140. The first and the second portions 140a, 140b of the front surface of the semiconductor substrate 140 are respectively formed by the p-type silicon carbide layer 143 and the n$^-$-type silicon carbide layer 142. In a center portion 101a of the active region 101, MOS gates configured by the p-type base region 113, n$^+$-type source regions 114 and p$^{++}$-type contact regions 115 of unit cells of the MOSFET, trenches 116, gate insulating films 117, and gate electrodes 118 are provided in a front side of the semiconductor substrate 140.

In an outer peripheral portion 101b of the active region 101, a p$^+$-type extension 122a, a p-type base extension 113a, and a p$^{++}$-type contact extension 115a are selectively provided in a surface region of the semiconductor substrate 140, at the first portion 140a of the front surface of the semiconductor substrate 140. The p$^+$-type extension 122a, the p-type base extension 113a, and the p$^{++}$-type contact extension 115a surround a periphery of the center portion 101a of the active region 101 and are extended portions respectively of a p$^+$-type region 122 closest to the chip end, the p-type base region 113, and the p$^{++}$-type contact region 115 closest to the chip end among the p$^{++}$-type contact regions 115 configuring the unit cells of the center portion 101a of the active region 101.

The p$^+$-type extension 122a, the p-type base extension 113a, and the p$^{++}$-type contact extension 115a reach a third portion (mesa edge of the drop) 140c connecting the first portion 140a and the second portion 140b of the front surface of the semiconductor substrate 140. Reference numerals 121 and 122 are p$^+$-type regions for mitigating electric field applied to the gate insulating films 117 at bottoms of the trenches 116. Reference numeral 123 is a p$^+$-type region provided in a surface region of the semiconductor substrate 140, at the third portion 140c of the front surface thereof. Reference numerals 119, 120, 125, and 133 are an interlayer insulating film, a source electrode, the drain electrode, and an n$^+$-type channel stopper region, respectively.

In the edge termination region 102, in a surface region of the semiconductor substrate 140, at the second portion 140b of the front surface of the semiconductor substrate 140, multiple p$^-$-type regions 131 of differing widths and multiple p$^{---}$-type regions 132 of differing widths are selectively provided in the n$^-$-type silicon carbide layer 142. The double-zone spatial modulation JTE structure 130 is configured by a spatial modulation JTE structure having a spatial modulation region 130b configured by the p$^-$-type regions 131 and a spatial modulation JTE structure having a spatial modulation region 130d configured by the p$^{---}$-type regions 132. The p$^-$-type regions 131 and the p$^{---}$-type regions 132 are disposed separate from one another, surrounding a periphery of the active region 101 concentrically.

An innermost one of the p$^-$-type regions 131 is adjacent to the p$^+$-type extension 122a. An innermost one of the p$^{---}$-type regions 132 is adjacent to the p$^+$-type extension 122a, extends closer to the chip end than is an outermost one of the p$^-$-type regions 131, and is positioned intervening all of the p$^-$-type regions 131 adjacent to one another. The p$^{---}$-type regions 132 excluding the innermost one of the p$^{---}$-type regions 132 are disposed closer to the chip end than are the p$^-$-type regions 131. The n$^-$-type drift region 112 is positioned intervening all of the p$^{---}$-type regions 132 adjacent to one another. All of the p$^-$-type regions 131 and the innermost one of the p$^{---}$-type regions 132 are fixed to a potential of the source electrode 120 via the p$^+$-type extension 122a.

The double-zone JTE structure is configured by the innermost one of the p$^-$-type regions 131 (hereinafter, JTE region 130a) and a portion (hereinafter, JTE region) 130c of the innermost one of the p$^{---}$-type regions 132, closer to the chip end than is the outermost one of the p$^-$-type regions 131. The spatial modulation region 130b between the JTE regions 130a, 130c is configured by the p$^-$-type regions 131 excluding the JTE region 130a and a portion of the innermost one of the p$^{---}$-type regions 132, between the JTE regions 130a, 130c. The spatial modulation region 130d adjacent to a side of the JTE region 130c facing the chip end is configured by the p$^{---}$-type regions 132 excluding the innermost one of the p$^{---}$-type regions 132 and the n$^-$-type drift region 112.

As a voltage withstanding structure of a conventional silicon carbide semiconductor device, a double-zone JTE structure (structure in which a p$^-$-type region and an adjacent p$^{---}$-type region closer to the chip end are disposed surrounding a periphery of an active region concentrically) and a double-zone spatial modulation JTE structure in which a FLR is provided in a double-zone JTE structure have been proposed (for example, refer to Japanese Laid-Open Patent Publication No. 2012-195519 and Japanese Patent No. 6672764). In Japanese Laid-Open Patent Publication No. 2012-195519, impurity concentration dependence of reverse breakdown voltage is reduced by the combination of the double-zone JTE structure and the FLR, and a margin of manufacturing processes is large. In Japanese Patent No. 6672764, the number of formation processes of the voltage withstanding structure is reduced, whereby adverse effects on the voltage withstanding structure due to process variation are reduced.

As another voltage withstanding structure of a conventional silicon carbide semiconductor device, a voltage withstanding structure configured by a p-type RESURF layer that makes electric field near the front surface of a semiconductor substrate uniform, a p$^+$-type edge termination layer fixed to a potential of a field plate and disposed in the RESURF layer, and multiple p$^+$-type FLRs disposed in and outside of the RESURF layer, surrounding a periphery of the edge termination layer concentrically has been proposed (for example, refer to Japanese Patent No. 3708057 and Japanese Patent No. 5827020). In Japanese Patent No. 3708057, a quantity, width, and arrangement interval of the FLR are disclosed. In Japanese Patent No. 3708057 and Japanese Patent No. 5827020, impurity concentrations of the RESURF layer, the edge termination layer, and the FLRs are disclosed.

SUMMARY OF THE INVENTION

According to an embodiment of the invention, a silicon carbide semiconductor device includes: a semiconductor substrate containing silicon carbide and having an active region and a termination region surrounding a periphery of the active region, the semiconductor substrate having a first main surface and a second main surface opposite to each other, the active region including a center portion and an outer peripheral portion surrounding a periphery of the center portion; a first-conductivity-type region provided in the semiconductor substrate, spanning both the active region and the termination region; a second-conductivity-type region provided in the active region, between the first main surface of the semiconductor substrate and the first-conductivity-type region; a semiconductor device element provided in the center portion of the active region and having a pn junction formed by the first-conductivity-type region and the second-conductivity-type region; a second-conductivity-type outer peripheral region provided in the outer peripheral portion of the active region and surrounding a periphery of the center portion of the active region; a first electrode of the semiconductor device element, provided on the first main surface of the semiconductor substrate, electrically connected to both the second-conductivity-type region and the second-conductivity-type outer peripheral region; a second electrode of the semiconductor device element, provided on the second main surface of the semiconductor substrate, electrically connected to the first-conductivity-type region; a plurality of field limiting rings (FLRs) of a second conductivity type, concentrically surrounding the periphery of the active region, and being selectively provided separate from one another, between the first main surface of the semiconductor substrate and the first-conductivity-type region, so that the FLRs configure a FLR structure in the termination region; and a plurality of second-conductivity-type low-concentration regions, concentrically surrounding the periphery of the active region, and being selectively provided separate from one another, between the first main surface of the semiconductor substrate and the first-conductivity-type region, so that the second-conductivity-type low-concentration regions configure a junction termination extension (JTE) structure in the termination region, the second-conductivity-type low-concentration regions having an impurity concentration lower than an impurity concentration of the FLRs. Of the plurality of the second-conductivity-type low-concentration regions, an innermost one that is located closest to the center portion is disposed adjacent to the second-conductivity-type outer peripheral region so as to be closer to an end of the semiconductor substrate than is the second-conductivity-type outer peripheral region, the innermost one extending closer to a periphery of the semiconductor substrate from a border between the first second-conductivity-type low-concentration region and the second-conductivity-type outer peripheral region than do the FLRs. Of the plurality of the second-conductivity-type low-concentration regions, the rest of regions other than the innermost one is disposed closer to the periphery of the semiconductor substrate than are the FLRs. Of the FLRs, a first FLR that is closest to the center portion is disposed overlapping both the second-conductivity-type outer peripheral region and the first second-conductivity-type low-concentration region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 12 is a table showing simulation conditions and judgment results for the experimental example.

DETAILED DESCRIPTION OF THE INVENTION

Figure 19:
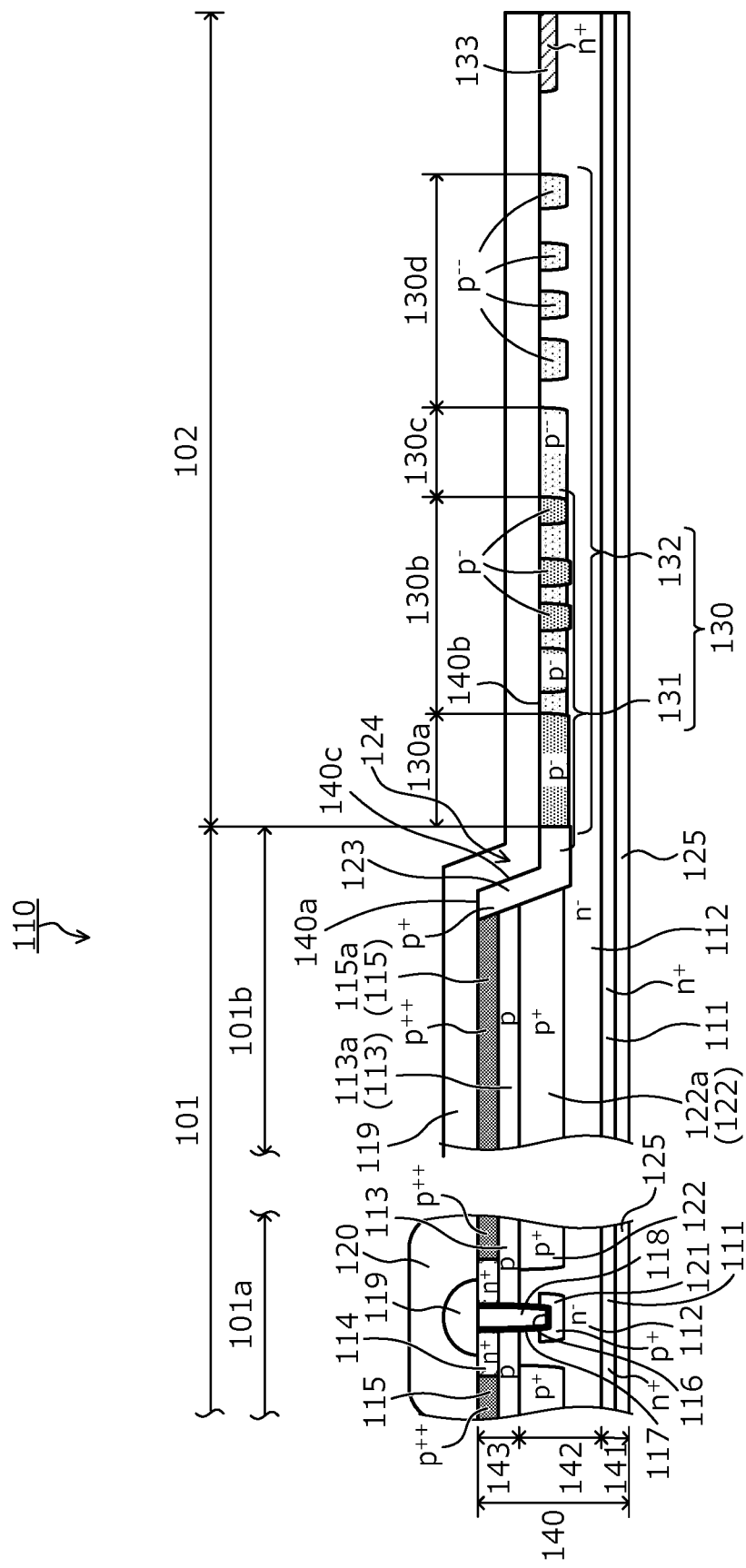
FIG. 19 is a cross-sectional view depicting a structure of a conventional silicon carbide semiconductor device.

First, problems associated with the conventional techniques above are discussed. In the conventional double-zone spatial modulation JTE structure 130 (refer to FIG. 19) described above, to adjust the spatial impurity concentration distribution of the entire double-zone spatial modulation JTE structure 130, multiple sessions of ion implantation for forming the p-type regions of differing impurity concentrations (in FIG. 19, the $p^-$-type regions 131 and the $p^{--}$-type regions 132) have to be performed by processes different from those for ion implantations for forming the p-type regions ($p^{++}$-type contact regions 115 and the $p^+$-type regions 121 to 123) of the active region 101. Therefore, the number of processes increases, leading to increases in cost.

In a general JTE structure and spatial modulation JTE structure as well (not depicted), multiple sessions of ion implantation for forming multiple p-type regions of differing impurity concentrations are necessary and therefore, has problems similar to those of the conventional double-zone spatial modulation JTE structure 130. A general FLR structure (not depicted) may be formed by a single session of ion implantation and while the number of processes may be reduced, the area of the voltage withstanding structure has to be increased to stably ensure a predetermined breakdown voltage. Therefore, in an instance in which costly silicon carbide is used as a semiconductor material, wafer cost increases, which is a major factor in increased cost.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described. Further, description indicating the same or equal means within a 5% range including allowable error due to process variation.

Figure 1:
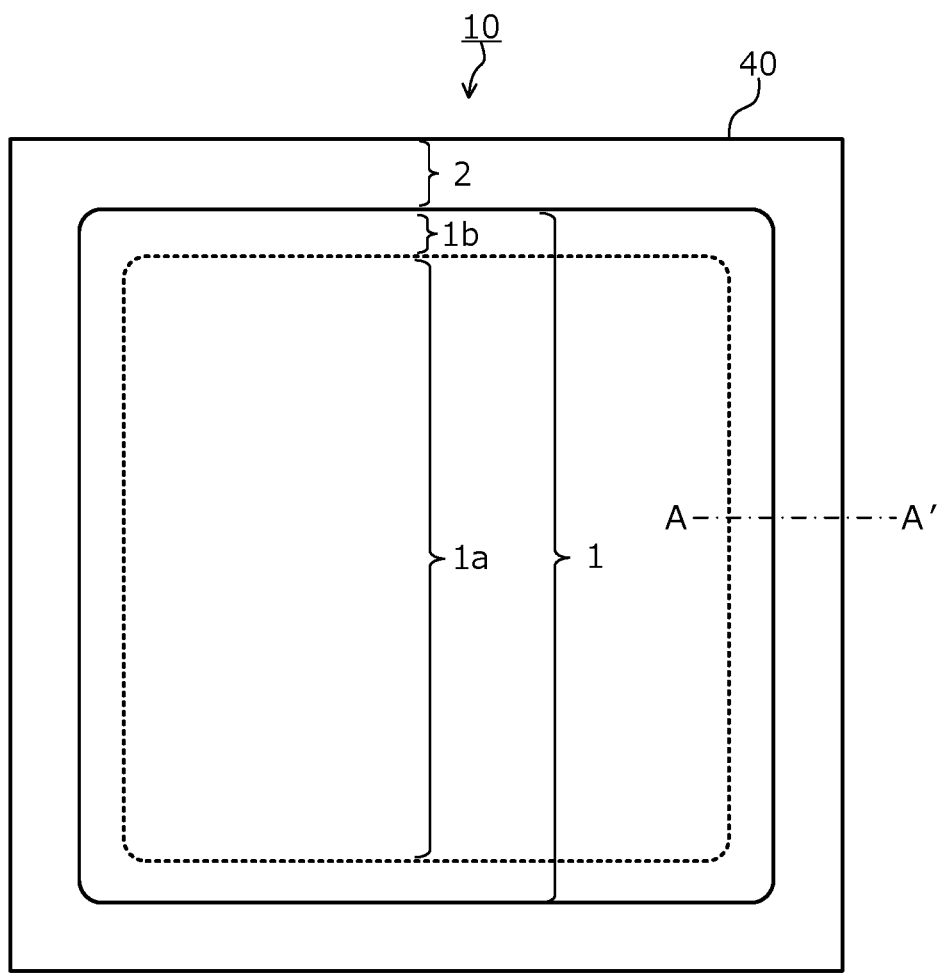
FIG. 1 is a plan view depicting a layout when a semiconductor device according to a first embodiment is viewed from a front side of a semiconductor substrate.
Figure 2:
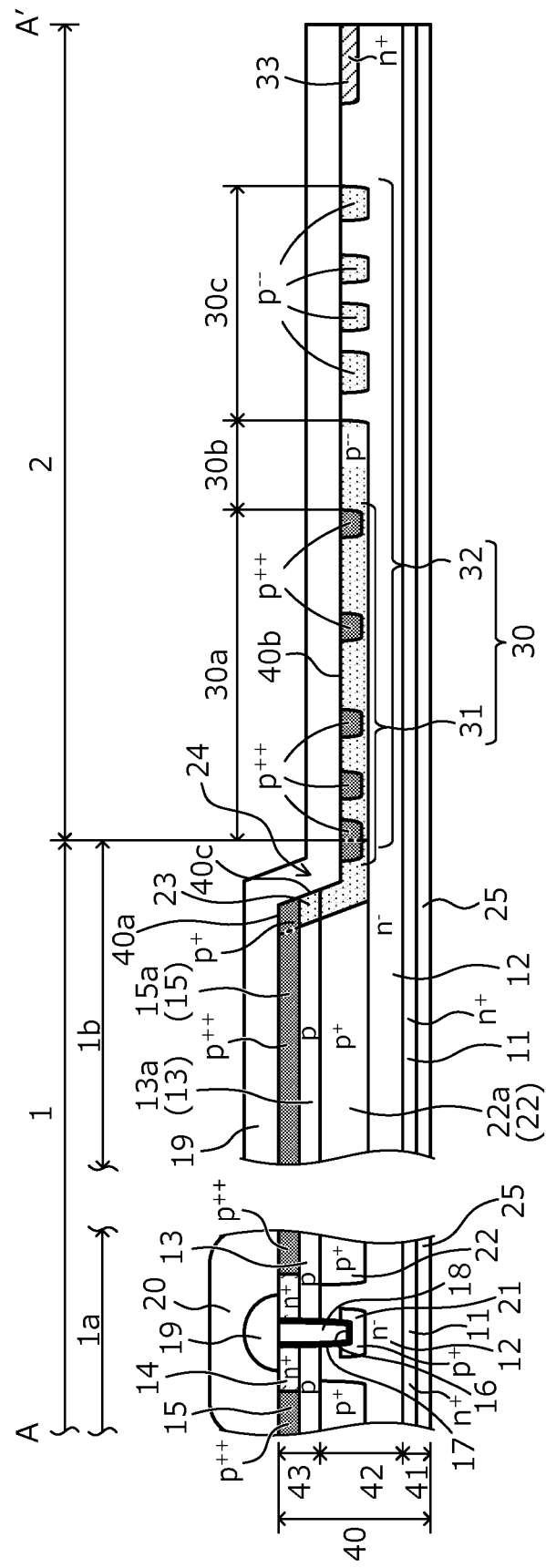
FIG. 2 is a cross-sectional view depicting a structure along cutting line A-A' in FIG. 1.

A structure of a silicon carbide semiconductor device according to a first embodiment is described. FIG. 1 is a plan view depicting a layout when a semiconductor device according to the first embodiment is viewed from a front side of a semiconductor substrate. FIG. 2 is a cross-sectional view depicting a structure along cutting line A-A' in FIG. 1. A silicon carbide semiconductor device 10 according to the first embodiment depicted in FIGS. 1 and 2 is a vertical MOSFET having a trench gate structure (device element structure) in an active region 1 of a semiconductor substrate (semiconductor chip) 40 that contains silicon carbide (SiC); the silicon carbide semiconductor device 10 further having, as a voltage withstanding structure in an edge termination region 2, a spatial modulation JTE structure 30 formed by a combination of a JTE structure and a FLR structure.

The active region 1 is a region through which a main current (drift current) flows when the MOSFET is in an ON state; multiple unit cells (semiconductor device elements) having a same structure as that of the MOSFET are disposed adjacently in a center portion 1a. The active region 1 has a substantially rectangular shape in a plan view and is disposed in substantially a center of the semiconductor substrate 40. In particular, the active region 1 is a portion on a chip-center-side of a border between a later-described $p^+$-type extension 22a and the JTE structure (later-described innermost one of the $p^{---}$-type regions 32). The edge termination region 2 is a region between the active region 1 and ends (chip ends) of the semiconductor substrate 40 and surrounds a periphery of the active region 1 in a substantially rectangular shape. The spatial modulation JTE structure 30 disposed in the edge termination region 2 is described hereinafter.

In the semiconductor substrate 40, on a front surface of an $n^+$-type starting substrate 41 containing silicon carbide and constituting an $n^+$-type drain region (first-conductivity-type region) 11, silicon carbide layers (first-conductivity-type and second-conductivity-type semiconductor layers) 42, 43 constituting an $n^-$-type drift region (first-conductivity-type region) 12 and a p-type base region (second-conductivity-type region) 13 are sequentially formed by epitaxial growth. A main surface of the semiconductor substrate 40 having the p-type silicon carbide layer 43 is regarded as a front surface while another main surface (back surface of the $n^+$-type starting substrate 41) thereof having the $n^+$-type starting substrate 41 is regarded as a back surface. In the center portion 1a of the active region 1, MOS gates configured by the p-type base region 13, $n^+$-type source regions (first semiconductor regions) 14, $p^{++}$-type contact regions (second semiconductor regions) 15, trenches 16, gate insulating films 17, and gate electrodes 18 are provided in the semiconductor substrate 40, at the front surface thereof.

The $n^+$-type starting substrate 41 is the $n^+$-type drain region 11. The $n^-$-type drift region 12 is a portion of the $n^-$-type silicon carbide layer 42 other than later-described first and the second $p^+$-type regions 21, 22, an n-type current spreading region (not depicted), later-described FLRs 31, and $p^+$-type regions 32. The $n^-$-type drift region 12 is provided between and in contact with the $n^+$-type starting substrate 41 and the first and the second $p^+$-type regions 21, 22, the FLRs 31, and the $p^+$-type regions 32, from the active region 1 to chip end. The p-type base region 13 is a portion of the p-type silicon carbide layer 43 other than the $n^+$-type source regions 14 and the $p^{++}$-type contact regions 15, and is provided between a later-described first portion of the front surface of the semiconductor substrate 40 and the $n^-$-type drift region 12.

The $n^+$-type source regions 14 and the $p^{++}$-type contact regions 15 are selectively provided between the front surface of the semiconductor substrate 40 and the p-type base region 13. The $n^+$-type source regions 14 and the $p^{++}$-type contact regions 15 are in contact with the p-type base region 13 and are exposed at the front surface of the semiconductor substrate 40. Being exposed at the front surface of the semiconductor substrate 40 means being in contact with a later-described source electrode (first electrode) 20 by a contact hole of a later-described interlayer insulating film 19. The $p^{++}$-type contact regions 15 may be omitted. In this instance, instead of the $p^{++}$-type contact regions 15, the p-type base region 13 is exposed at the front surface of the semiconductor substrate 40.

In the active region 1, the n-type current spreading region (not depicted) is a so-called current spreading layer (CSL) that reduces carrier spreading resistance and may be provided between the $n^-$-type drift region 12 and the p-type base region 13. The n-type current spreading region is provided between adjacent trenches of the trenches 16 and reaches a deep position closer to the $n^+$-type drain region 11 than are bottoms of the trenches 16. The first and the second $p^+$-type regions 21, 22 are provided at deep positions closer to the $n^+$-type drain region 11 that are the bottoms of the trenches 16. The first and the second $p^+$-type regions 21, 22 have a function of mitigating electric field applied to the bottoms of the trenches 16.

The first $p^+$-type regions 21 are disposed separate from the p-type base region 13 and respectively face the bottoms of the trenches 16 in a depth direction Z. The first $p^+$-type regions 21 are electrically connected to the source electrode (first electrode) 20 by non-depicted portions. The second $p^+$-type regions 22 are provided between adjacent trenches of the trenches 16, separate from the first $p^+$-type regions 21 and the trenches 16 and in contact with the p-type base region 13. The trenches 16 penetrate through the $n^+$-type source regions 14 and the p-type base region 13 in the depth direction Z and reach the $n^-$-type drift region 12 (in an instance in which the n-type current spreading region is omitted, the n-type current spreading region).

The trenches 16, for example, extend in a striped pattern in a first direction X parallel to the front surface of the semiconductor substrate 40. Between adjacent trenches of the trenches 16, the p-type base region 13, the $n^+$-type source regions 14, the $p^{++}$-type contact regions 15 and the second $p^+$-type regions 22 extend linearly in the first direction X parallel to the trenches 16. The $p^{++}$-type contact regions 15 may be scattered in the first direction X. In the trenches 16, the gate electrodes 18 are provided, respectively, via the gate insulating films 17, respectively. All of the gate electrodes 18 are electrically connected to one another via a gate runner (non-depicted gate wiring layer).

The interlayer insulating film 19 is provided in an entire area of the front surface of the semiconductor substrate 40 and covers the gate electrodes 18. The source electrode 20, in the active region 1, is provided in an entire area of the front surface of the semiconductor substrate 40. The source electrode 20 is in contact with the $n^+$-type source regions 14 and the $p^{++}$-type contact regions 15 exposed by contact holes of the interlayer insulating film 19, the source electrode 20 being electrically connected to the p-type base region 13, the $n^+$-type source regions 14, and the $p^{++}$-type contact regions 15. A drain electrode (second electrode) 25 is provided in an entire area of the back surface (back surface of the n⁺-type starting substrate 41) of the semiconductor substrate 40 and is electrically connected to the n⁺-type drain region 11 (the n⁺-type starting substrate 41).

At the front surface of the semiconductor substrate 40, for example, the p-type silicon carbide layer 43 is removed from an entire area of the edge termination region 2, thereby forming a drop 24, whereby a portion (second portion) 40b closer to an outer side (end of the semiconductor substrate 40 (chip end)) than is an inner portion (first portion) 40a that is relatively closer to a center of the semiconductor substrate 40 (chip center) is lowered (recessed) toward the drain electrode 25. In an area closer to the chip center than is the drop 24, the p-type silicon carbide layer 43 is left in a mesa (trapezoidal shape) shape. A surface (exposed surface) of the n⁻-type silicon carbide layer 42 closer to the chip end than is the drop 24 is the second portion 40b of the front surface of the semiconductor substrate 40.

A portion (mesa edge of the drop 24, hereinafter, third portion) 40c of the front surface of the semiconductor substrate 40 connects the first portion 40a and the second portion 40b, and separates elements of the active region 1 and elements of the edge termination region 2. The active region 1 is a portion closer to the chip center than is the drop 24 and includes the first portion 40a of the semiconductor substrate 40. The edge termination region 2 is a portion from the drop 24 to the chip end and includes the second and the third portions 40b, 40c of the semiconductor substrate 40. In an outer peripheral portion 1b of the active region 1, a p-type region (second-conductivity-type outer peripheral region) is provided in a surface region of the semiconductor substrate 40, at the first portion 40a of the front surface the semiconductor substrate 40, said p-type region being formed by the p⁺-type extension 22a, a p-type base extension 13a, and a p⁺⁺-type contact extension 15a.

The p⁺-type extension 22a, the p-type base extension 13a, and the p⁺⁺-type contact extension 15a surround a periphery of the center portion 1a of the active region 1 in a substantially rectangular shape and extend toward the chip end from the center portion 1a of the active region 1, reaching the third portion 40c of the front surface of the semiconductor substrate 40. The p⁺-type extension 22a is an extension of an outermost one of the second p⁺-type regions 22 of the center portion 1a of the active region 1. The p⁺-type extension 22a reaches a deep position closer to the drain electrode 25 than is the second portion 40b of the front surface of the semiconductor substrate 40. The p⁺-type extension 22a extends closer to the chip end than does the drop 24 and encompasses an entire border between the second portion 40b and the third portion 40c of the front surface of the semiconductor substrate 40.

The p-type base extension 13a is an extension of the p-type base region 13. The p-type base extension 13a is provided between the first portion 40a of the front surface of the semiconductor substrate 40 and the p⁺-type extension 22a. The p⁺⁺-type contact extension 15a is an extension of an outermost one of the p⁺⁺-type contact regions 15. The p⁺⁺-type contact extension 15a is provided between the first portion 40a of the front surface of the semiconductor substrate 40 and the p-type base extension 13a. The p⁺⁺-type contact extension 15a is in contact with the source electrode 20; and the p⁺-type extension 22a and the p-type base extension 13a are fixed to a potential of the source electrode 20 via the p⁺⁺-type contact extension 15a.

The p⁺-type extension 22a, the p-type base extension 13a, and the p⁺⁺-type contact extension 15a have a function of making electric field at the first portion 40a of the front surface of the semiconductor substrate 40 uniform in the outer peripheral portion 1b of the active region 1. Hole (positive hole) current flows toward the active region 1 and is generated by the n⁻-type drift region 12 of the edge termination region 2 when the MOSFET is OFF; and the p⁺-type extension 22a, the p-type base extension 13a, and the p⁺⁺-type contact extension 15a are regions for pulling out the positive hole current from the p⁺⁺-type contact extension 15a to the source electrode 20 and have a function of suppressing concentration of the positive hole current during avalanche breakdown in the edge termination region 2.

Along the third portion 40c of the front surface of the semiconductor substrate 40, a p⁺-type region (hereinafter, p⁺-type drop region) 23 is provided so as to overlap the p⁺-type extension 22a, the p-type base extension 13a, and the p⁺⁺-type contact extension 15a. The p⁺-type drop region 23 is formed by ion implantation concurrently with the p⁻⁻⁻-type regions 32, extends from the active region 1 to be closer to the chip end than is the drop 24, and is exposed at the second and the third portions 40b, 40c. Being exposed at the second and the third portions 40b, 40c means to be in contact with the interlayer insulating film 19 on the second and the third portions 40b, 40c. In FIG. 2, a portion of the p⁺-type drop region 23 overlapping the p⁺⁺-type contact extension 15a is indicated by a dashed line while a portion overlapping the p⁺-type extension 22a and the p-type base extension 13a is indicated by a solid line (similarly in FIG. 11).

The p⁺-type drop region 23 encompasses the entire border between the second portion 40b and the third portion 40c of the front surface of the semiconductor substrate 40. As described above, the p⁺-type drop region 23 is formed concurrently with the p⁻⁻⁻-type regions 32 so as to overlap the p-type regions of the outer peripheral portion 1b of the active region 1 and therefore, the p⁺-type drop region 23 has an impurity concentration that is higher than an impurity concentration of the p-type base region 13, which has the lowest impurity concentration of the p-type regions of the outer peripheral portion 1b of the active region 1. The interlayer insulating film 19 extends spanning the active region 1 and the edge termination region 2 so as to cover the front surface of the semiconductor substrate 40 (the first to the third portions 40a to 40c). In the outer peripheral portion 1b of the active region 1 and the edge termination region 2, a field oxide film may be provided between the front surface of the semiconductor substrate 40 and the interlayer insulating film 19.

A structure of the spatial modulation JTE structure 30 is described. The spatial modulation JTE structure 30 is configured by a JTE region 30b and spatial modulation regions 30a, 30c (refer to FIG. 2) and has a function of mitigating electric field of a front side of the semiconductor substrate 40 and sustaining a breakdown voltage. A spatial p-type impurity concentration distribution of an entire area of the spatial modulation JTE structure 30 gradually decreases toward the chip ends. The breakdown voltage is a voltage limit at which no erroneous operation or destruction of the MOSFET occurs. In particular, the spatial modulation JTE structure 30 is configured by the FLR structure formed by multiple p⁺⁺-type regions (FLRs) 31, and the spatial modulation JTE structure formed by the p⁻⁻⁻-type regions 32 and the n⁻-type drift region 12.

In a surface region of the semiconductor substrate 40, at the second portion 40b of the front surface of the semiconductor substrate 40, the FLRs 31 and the p⁻⁻⁻-type regions (second-conductivity-type low-concentration regions) 32 are selectively provided in the n⁻-type silicon carbide layer 42 and are exposed at the second portion 40b. In FIG. 2, the FLRs 31 and the p⁻⁻⁻-type regions 32 are indicated by different hatching. Impurity concentrations, widths, and arrangement of the FLRs 31 and the p⁻⁻⁻-type regions are adjusted, whereby the breakdown voltage of the edge termination region 2 is adjusted. The FLRs 31 have substantially a same width (width in a direction of the normal) and are disposed separate from one another, concentrically surrounding a periphery of the active region 1. Substantially the same width means a same width within a range including allowable error due to process variation. An innermost (closest to the chip center) one (first FLR) of the FLRs 31 may be wider than others of the FLRs 31.

A spreading dimension of the FLR structure, for example, may be in a range from about 0.1 µm to 2.5 µm. While the breakdown voltage of the edge termination region 2 varies due to variation of a dose amount of the p⁻⁻⁻-type regions 32 (refer to FIGS. 13 to 15), the spreading dimension of the FLR structure is within the range described, whereby the predetermined breakdown voltage of the edge termination region 2 may be ensured within a range of variation of the dose amount of the p⁻⁻⁻-type regions 32. Variation of the dose amount of the p⁻⁻⁻-type regions 32 is a variation of an ion implantation amount of an ion implantation for forming the p⁻⁻⁻-type regions 32 or a variation of an activation rate of the ion-implanted impurity or both.

In particular, the spreading dimension of the FLR structure, for example, may be in a range from about 0.2 µm to 1.0 µm. As a result, within a range of variation of the dose amount of the p⁻⁻⁻-type regions 32, a minimum breakdown voltage of the edge termination region 2 may be increased. The spreading dimension of the FLR structure is a difference ($=d_{n+1}-d_n$) of an interval $d_n$ between one of the FLRs 31 and an inner adjacent one of the FLRs 31, closer to the chip center than is the one of the FLRs 31, and an interval $d_{n+1}$ between the one of the FLRs 31 and an outer adjacent one of the FLRs 31, closer to the chip end than is the one of the FLRs 31 (refer to FIG. 11). The spreading dimension is uniform in the FLR structure and an interval between adjacent FLRs of the FLRs 31 increases by the predetermined spreading dimension the closer the FLRs 31 are to the chip end.

The FLRs 31 terminate at shallow positions farther from the drain electrode 25 than does the p⁺-type extension 22a (depth of the FLRs 31 is shallower than that of the p⁺-type extension 22a). An innermost one of the FLRs 31 is disposed overlapping the p⁺-type extension 22a and an innermost one of the p⁻⁻⁻-type regions (first second-conductivity-type low-concentration region) 32, at a position overlapping a border between the p⁺-type extension 22a and the innermost one of the p⁻⁻⁻-type regions 32. The rest of regions of the FLRs 31 other than the innermost one may also be referred to as a second second-conductivity-type low-concentration region. In FIG. 2, an outer end of the p⁺-type extension 22a is indicated by a dashed line (similarly in FIG. 11). Even when arrangement of the FLRs 31 deviates toward the chip end by, for example, about 1 µm, due to misalignment during positioning (alignment) of an ion implantation mask for forming the FLRs 31, the width of the innermost one of the FLRs 31 suffices to be set so that the innermost one of the FLRs 31 is disposed overlapping the p⁺-type extension 22a and the innermost one of the p⁻⁻⁻-type regions 32. The innermost one of the FLRs 31 may be adjacent to an outer side of the p⁺-type drop region 23 or may be positioned overlapping an outer end of the p⁺-type drop region 23.

The FLRs 31 terminate at shallow positions farther from the drain electrode 25 than do the p⁻⁻⁻-type regions 32 (depth of the FLRs 31 is shallower than that of the p⁻⁻⁻-type regions 32). As a result, as described hereinafter, all of the FLRs 31 are surrounded by the innermost one of the p⁻⁻⁻-type regions 32. Ends of the FLRs 31 facing the drain electrode 25 are surrounded by said p⁻⁻⁻-type region 32 having an impurity concentration lower than that of the FLRs 31, whereby concentration of electric field at the ends of the FLRs 31 facing the drain electrode 25 is mitigated and the breakdown voltage of the edge termination region 2 may be enhanced. All of the FLRs 31 have substantially the same impurity concentration. The impurity concentration of the FLRs 31 is higher than the impurity concentration of the p⁺-type extension 22a and the impurity concentration of the p⁺-type drop region 23.

For example, all of the FLRs 31 may be formed concurrently with the p⁺⁺-type contact regions 15 and may have substantially the same impurity concentration as the impurity concentration of the p⁺⁺-type contact regions 15. The impurity concentration of the FLRs 31 is set to be higher than that of p⁺-type regions of the active region 1, whereby the breakdown voltage of the edge termination region 2 is higher than the breakdown voltage of the active region 1 and avalanche breakdown at the edge termination region 2 is suppressed. For example, the impurity concentration of the FLRs 31 may be in a range from about $1\times10^{18}/\text{cm}^3$ to $1\times10^{21}/\text{cm}^3$. The impurity concentration of the FLRs 31 is set within the described range, whereby even when high electric field is applied, the FLRs 31 may be caused to function as the FLR structure without complete depletion occurring.

The p⁻⁻⁻-type regions 32 are disposed separate from one another, concentrically surrounding a periphery of the active region 1. An interval between adjacent p⁻⁻⁻-type regions of the p⁻⁻⁻-type regions 32 increases the closer the adjacent p⁻⁻⁻-type regions of the p⁻⁻⁻-type regions 32 are to the chip end. The p⁻⁻⁻-type regions 32 terminate at deep positions closer to the drain electrode 25 than do the FLRs 31. The innermost one of the p⁻⁻⁻-type regions 32 is adjacent to the p⁺-type extension 22a and closer to the chip end than is the p⁺-type extension 22a; the innermost one of the p⁻⁻⁻-type regions 32 extends closer to the chip end than does an outermost one of the FLRs 31 and surrounds all of the FLRs 31. The innermost one of the p⁻⁻⁻-type regions 32 is positioned between all adjacent FLRs of the FLRs 31. In other words, the FLR structure is provided inside the innermost one of the p⁻⁻⁻-type regions 32.

An impurity concentration of the p⁻⁻⁻-type regions 32 is lower than respective impurity concentrations of the p-type regions (the p⁺-type extension 22a, the p-type base extension 13a, the p⁺⁺-type contact extension 15a, and the p⁺-type drop region 23, etc.) of the active region 1. All of the p⁻⁻⁻-type regions 32 have substantially the same impurity concentration and this impurity concentration is about, for example, in lower range of $10^{17}/\text{cm}^3$. A target dose amount of the p⁻⁻⁻-type regions 32 may be, for example, in a range from about $5.5\times10^{12}/\text{cm}^2$ to $2.1\times10^{13}/\text{cm}^2$ (refer to FIGS. 13 to 15). The target dose amount of the p⁻⁻⁻-type regions 32 is a dose amount design value of an ion implantation for forming the p⁻⁻⁻-type regions 32.

In the edge termination region 2 during high-temperature operation, positive charge is accumulated at an interface between a passivation film (polyimide protective film) covering the front surface of the semiconductor substrate 40 and an oxide film therebelow (single layer of the interlayer insulating film 19 or a stacked film including the field oxide film and the interlayer insulating film 19), whereby the target dose amount of the p$^{---}$-type regions 32 varies and therefore, is suitably set according to an amount of accumulated charge that can be assumed. Variation of the dose amount of the p$^{---}$-type regions 32 may be about ±20% of the target dose amount of the p$^{---}$-type regions 32. Variation of the dose amount of the p$^{---}$-type regions 32 is set within this range, whereby a predetermined breakdown voltage of the edge termination region 2 may be stably ensured.

All of the FLRs 31 and the innermost one of the p$^{---}$-type regions 32 are electrically connected to the source electrode 20 via the p$^{+}$-type extension 22a, the p-type base extension 13a, and the p$^{++}$-type contact extension 15a. Excluding the innermost one of the p$^{---}$-type regions 32, the p$^{---}$-type regions 32 are disposed closer to the chip end than are the FLRs 31. Between adjacent p$^{---}$-type regions of the p$^{---}$-type regions 32, the n$^{-}$-type drift region 12 extends in a direction from the drain electrode 25 toward the front surface of the semiconductor substrate 40 and reaches the second portion 40b of the front surface of the semiconductor substrate 40. As a result, the n$^{-}$-type drift region 12 is positioned between all adjacent p$^{---}$-type regions of the p$^{---}$-type regions 32.

By the respective dose amounts, widths, and arrangements of the FLRs 31 and the p$^{---}$-type regions 32, a predetermined breakdown voltage of the edge termination region 2 is ensured. The FLRs 31 and portions of the innermost one of the p$^{---}$-type regions 32 between adjacent FLRs of the FLRs 31 repeatedly alternate one another and are adjacent to one another in the direction of the normal, whereby the spatial modulation region 30a is configured. The JTE region 30b adjacent to the spatial modulation region 30a and closer to the chip end than is the spatial modulation region 30a is configured by an outer portion of the innermost one of the p$^{---}$-type regions 32, the outer portion being closer to the chip end than is the outermost one of the FLRs 31. The p$^{---}$-type regions 32 other than the innermost one of the p$^{---}$-type regions 32 and the n$^{-}$-type drift region 12 repeatedly alternate one another and are adjacent to one another in the direction of the normal, whereby the spatial modulation region 30c adjacent to the JTE region 30b and closer to the chip end than is the JTE region 30b is configured.

In a surface region of the semiconductor substrate 40, at the second portion 40b of the front surface of the semiconductor substrate 40, an n$^{+}$-type channel stopper region 33 is selectively provided in the n$^{-}$-type silicon carbide layer 42. The n$^{+}$-type channel stopper region 33 is disposed separate from the spatial modulation JTE structure 30, closer to the chip end than is the spatial modulation JTE structure 30 and is exposed at the chip end. Between the n$^{+}$-type channel stopper region 33 and an outermost one of the p$^{---}$-type regions 32, the n$^{-}$-type drift region 12 extends in a direction away from the drain electrode 25. An interval between the n$^{+}$-type channel stopper region 33 and the outermost one of the p$^{---}$-type regions 32 is longer than an interval between adjacent p$^{---}$-type regions of the p$^{---}$-type regions 32. The n$^{+}$-type channel stopper region 33, for example, may have an impurity concentration that is substantially the same as that of the n$^{+}$-type source regions 14.

Operation of the silicon carbide semiconductor device 10 according to the first embodiment is described. In a state in which voltage that is positive with respect to the source electrode 20 (forward voltage) is applied to the drain electrode 25, when voltage that is at least equal to a gate threshold voltage is applied to the gate electrodes 18, a channel (n-type inversion layer) is formed in portions of the p-type base region 13 along the trenches 16. As a result, current flows from the n$^{+}$-type drain region 11 and passes through the n$^{-}$-type drift region 12 and the channel (the n-type inversion layer formed along sidewalls of the trenches 16 in the p-type base region 13) to the n$^{+}$-type source regions 14, whereby the MOSFET (the silicon carbide semiconductor device 10) turns ON.

On the other hand, in a state in which forward voltage is applied between a source and drain, when voltage smaller than the gate threshold voltage is applied to the gate electrodes 18, in the active region 1, pn junctions between the first and the second p$^{+}$-type regions 21, 22, the p-type base region 13 and the n$^{-}$-type drift region 12 are reverse biased, whereby the MOSFET maintains the OFF state. At this time, a depletion layer spreads from the pn junctions and electric field applied to the bottoms of the trenches 16 positioned closer to the source electrode 20 than are the pn junctions is mitigated.

Further, when the MOSFET is OFF, the depletion layer that spreads from the described pn junctions of the active region 1 spreads across the edge termination region 2 in a horizontal direction toward the outer side (chip end) by the pn junctions between the n$^{-}$-type drift region 12 and the p-type regions of the spatial modulation JTE structure 30 formed so as to surround a periphery of the active region 1. A predetermined breakdown voltage based on dielectric breakdown electric field strength of silicon carbide and a depletion layer width (width in the direction of the normal toward the chip end, from the active region 1) may be ensured by the amount that the depletion layer spreads across the edge termination region 2 to the chip end.

Next, a method of manufacturing the silicon carbide semiconductor device 10 according to the first embodiment is described. FIGS. 3, 4, 5, and 6 are cross-sectional views depicting states of the silicon carbide semiconductor device according to the first embodiment during manufacture. In FIGS. 3 to 6, only the outer peripheral portion 1b of the active region 1 and the edge termination region 2 of one chip region 50a (refer to FIG. 2) is depicted and the center portion 1a of the active region 1 is described with reference to FIG. 2. The chip region 50a is a region constituting a semiconductor chip (the semiconductor substrate 40) after a semiconductor wafer 50 is diced (cut); in a center portion of the semiconductor wafer 50, the chip region 50a is formed in plural, for example, in a matrix-like pattern, surrounded by lattice dicing lines (cutting lines) 50b.

Figure 3:
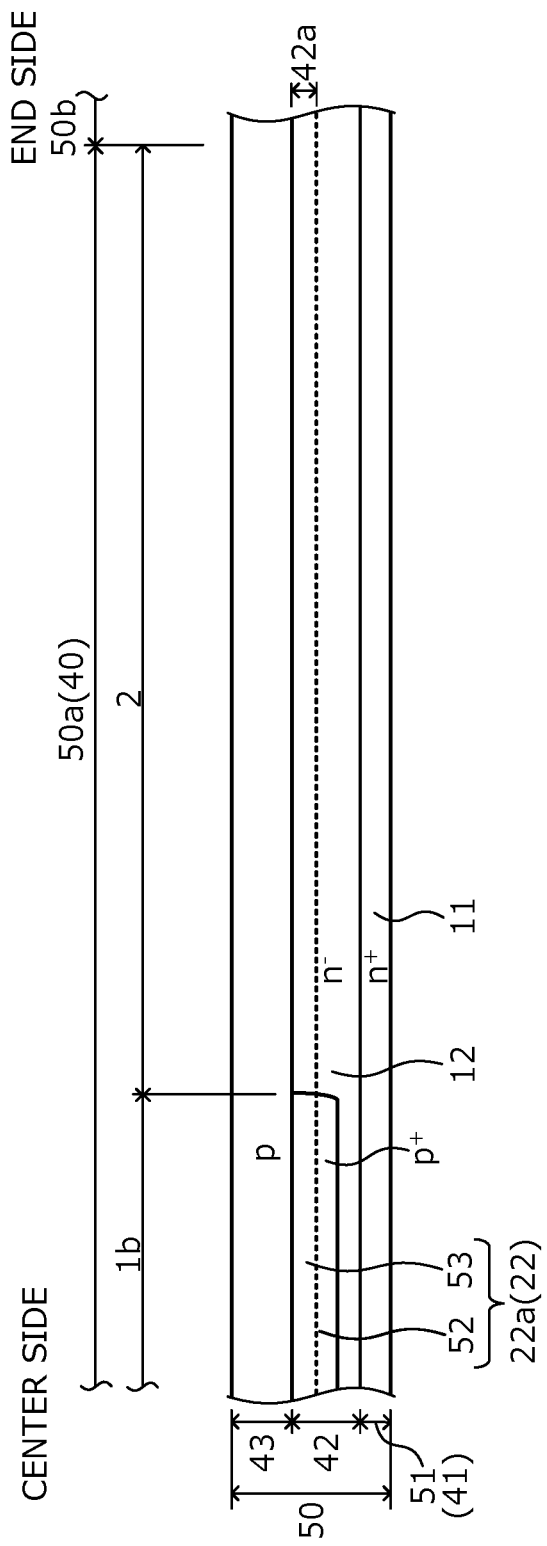
FIG. 3 is a cross-sectional view depicting a state of the silicon carbide semiconductor device according to the first embodiment during manufacture.

First, as depicted in FIG. 3, an n$^{+}$-type starting wafer 51 constituting the n$^{+}$-type starting substrate 41 is prepared. Next, the n$^{-}$-type silicon carbide layer 42 constituting the n$^{-}$-type drift region 12 is epitaxially grown on the front surface of the n$^{+}$-type starting wafer 51. Next, by photolithography and ion implantation of a p-type impurity, in the center portion 1a of the active region 1, the first p$^{+}$-type regions 21 and lower portions of the second p$^{+}$-type regions 22 are each selectively formed in surface regions of the n$^{-}$-type silicon carbide layer 42. Concurrently with the lower portions of the second p$^{+}$-type regions 22, in the outer peripheral portion 1b of the active region 1, a lower portion 52 of the p$^{+}$-type extension 22a is formed in a surface region of the n$^{-}$-type silicon carbide layer 42.

Next, an ion implantation mask (not depicted) used in forming the first p$^{+}$-type regions 21 and the lower portions of the second p$^{+}$-type regions 22 is removed and thereafter, an n$^{-}$-type silicon carbide layer is further epitaxially grown on the n$^{-}$-type silicon carbide layer 42 increasing the thickness thereof so that the n$^{-}$-type silicon carbide layer 42 has a product (the silicon carbide semiconductor device 10) thickness. Next, by photolithography and ion implantation of a p-type impurity, in the center portion 1a of the active region 1, upper portions of the second p$^+$-type regions 22 are formed in a portion 42a that increases the thickness of the n$^-$-type silicon carbide layer 42. The upper portions and the lower portions of the second p$^+$-type regions 22 are connected in the depth direction, thereby forming the second p$^+$-type regions 22.

Concurrently with the formation of the upper portions of the second p$^+$-type regions 22, in the outer peripheral portion 1b of the active region 1, in a surface region of the portion 42a that increases the thickness of the n$^-$-type silicon carbide layer 42, an upper portion 53 of the p$^+$-type extension 22a is formed. The upper portion 53 and the lower portion 52 of the p$^+$-type extension 22a are connected in the depth direction, thereby forming the p$^+$-type extension 22a. Next, at the surface of the n$^-$-type silicon carbide layer 42, the p-type silicon carbide layer 43 constituting the p-type base region 13 is epitaxially grown. As a result, the semiconductor wafer 50 in which the silicon carbide layers 42, 43 constituting the n$^-$-type drift region 12 and the p-type base region 13 are sequentially formed on the front surface of the n$^+$-type starting wafer 51 is completed.

In an instance in which the n-type current spreading region is formed, after the n$^-$-type silicon carbide layer 42 is formed on the front surface of the n$^+$-type starting wafer 51 but before the epitaxial growth for increasing the thickness of the n$^-$-type silicon carbide layer 42, a lower portion of the n-type current spreading region is formed in a surface region of the n$^-$-type silicon carbide layer 42, in an entire area of the active region 1, by photolithography and ion implantation of an n-type impurity. Further, after the thickness of the n$^-$-type silicon carbide layer 42 is increased, in the portion 42a that increases the thickness of the n$^-$-type silicon carbide layer 42, an upper portion of the n-type current spreading region suffices to be formed in a surface region of the n$^-$-type silicon carbide layer 42, in an entire area of the active region 1, so as to be connected to the lower portion of the n-type current spreading region.

Figure 4:
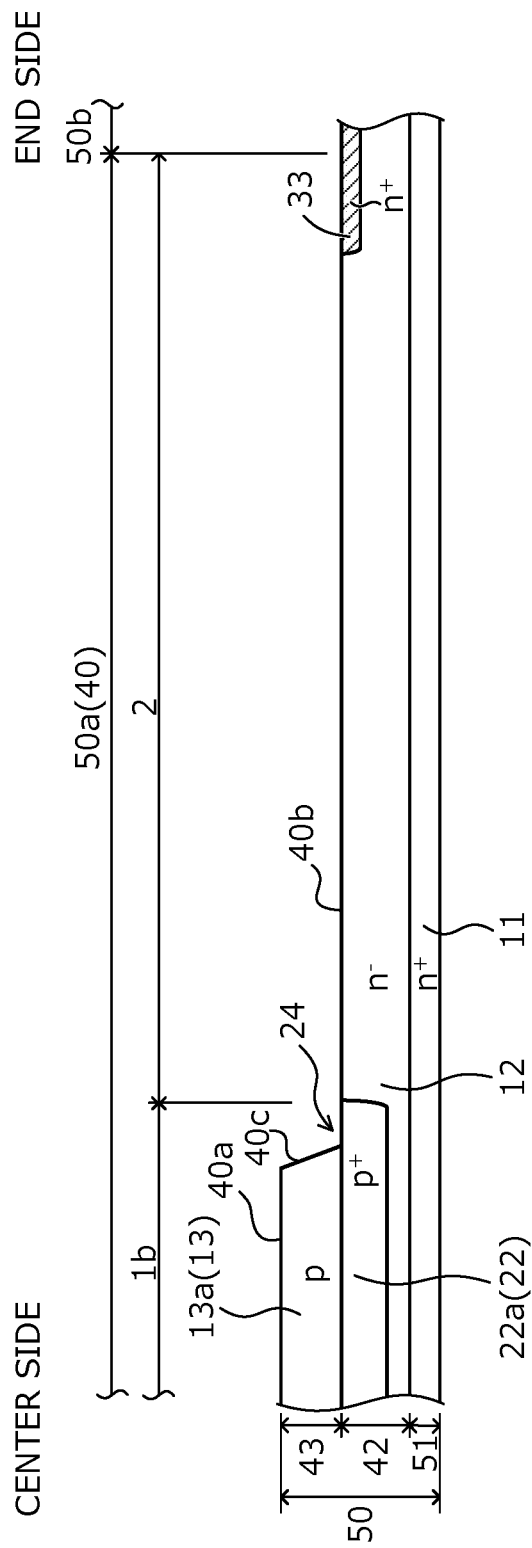
FIG. 4 is a cross-sectional view depicting a state of the silicon carbide semiconductor device according to the first embodiment during manufacture.

Next, as depicted in FIG. 4, a portion of the p-type silicon carbide layer 43 in the edge termination region 2 is removed by photolithography and etching, leaving the p-type silicon carbide layer 43 only in the active region 1. As a result, at the front surface of the semiconductor wafer 50, the drop 24 whereby the portion (the second portion 40b) closer to the chip end than is the inner portion (the first portion 40a) is lowered (recessed) toward the n$^+$-type starting wafer 51 is formed and in the edge termination region 2, the n$^-$-type silicon carbide layer 42 is exposed at the second portion 40b of the front surface of the semiconductor wafer 50. In the edge termination region 2, a surface region of the n$^-$-type silicon carbide layer 42 exposed at the second portion 40b of the front surface of the semiconductor wafer 50 may be slightly removed.

Next, an etching mask (not depicted) used in partially removing the p-type silicon carbide layer 43 is removed. Next, a process including photolithography, ion implantation of an impurity, and removal of an ion implantation mask (not depicted) as one set is repeatedly performed under different conditions, thereby selectively forming, in the semiconductor wafer 50, at the front surface thereof (surface of the p-type silicon carbide layer 43) in the active region 1, the n$^+$-type source regions 14, the p$^{++}$-type contact regions 15, and the p$^{++}$-type contact extension 15a in the p-type silicon carbide layer 43 and the p$^+$-type drop region 23, and further selectively forming in the edge termination region 2, the spatial modulation JTE structure 30 and the n$^+$-type channel stopper region 33 in the n$^-$-type silicon carbide layer 42.

Figure 5:
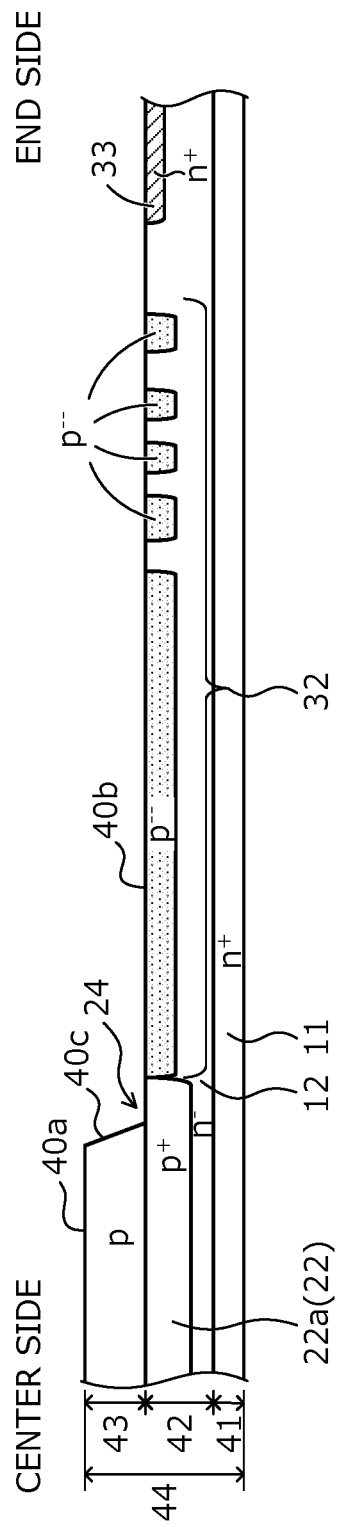
FIG. 5 is a cross-sectional view depicting a state of the silicon carbide semiconductor device according to the first embodiment during manufacture.
Figure 6:
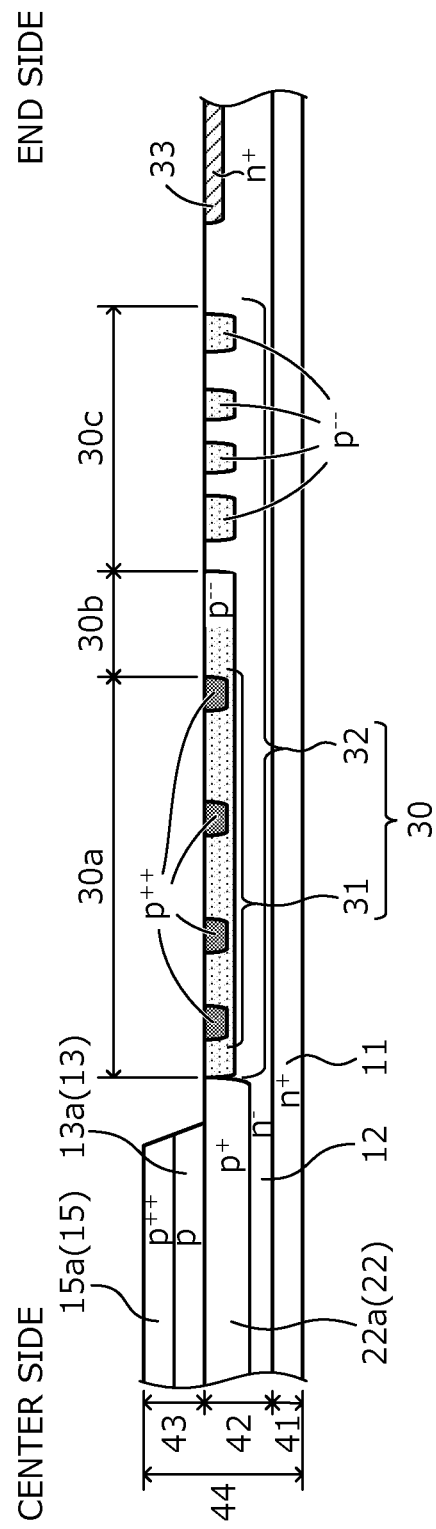
FIG. 6 is a cross-sectional view depicting a state of the silicon carbide semiconductor device according to the first embodiment during manufacture.

At this time, for example, concurrently with formation of the n$^+$-type source regions 14, in a surface region of the semiconductor wafer 50, at the second portion 40b of the front surface thereof (surface region of the n$^-$-type silicon carbide layer 42), the n$^+$-type channel stopper region 33 is selectively formed spanning ends of the chip region 50a and ends of other chip regions 50a adjacent thereto (FIG. 4). As depicted in FIG. 5, the p$^{---}$-type regions 32 are selectively formed in surface regions of the semiconductor wafer 50, at the second portion 40b of the front surface thereof. Further, as depicted in FIG. 6, concurrently with formation of the p$^{++}$-type contact regions 15 and the p$^{++}$-type contact extension 15a, the FLRs 31 may be selectively formed in the innermost one of the p$^{---}$-type regions 32.

A formation sequence of the FLRs 31, the p$^{---}$-type regions 32, and the n$^+$-type channel stopper region 33 may be interchanged. Portions of the n$^-$-type silicon carbide layer 42 free of ion implantation, between the n$^+$-type starting wafer 51 and the first and the second p$^+$-type regions 21, 22, the p$^+$-type extension 22a, the FLRs 31, the p$^{---}$-type regions 32 and the n$^+$-type channel stopper region 33 constitute the n$^-$-type drift region 12. Portions of the p-type silicon carbide layer 43 free of ion implantation, between the n$^-$-type silicon carbide layer 42 and the n$^+$-type source regions 14, the p$^{++}$-type contact regions 15 and the p$^{++}$-type contact extension 15a constitute the p-type base region 13 and the p-type base extension 13a.

Next, the ion-implanted impurities are activated by a heat treatment. Next, the trenches 16, the gate insulating films 17, the gate electrodes 18, the interlayer insulating film 19, the source electrode 20, the drain electrode 25, and the passivation film (polyimide protective film, not depicted) are formed by a general method. The passivation film may be pulled off by a dicing blade and therefore, before dicing, portions of the passivation film on dicing lines 50b are removed. Thereafter, the semiconductor wafer 50 is diced along the dicing lines 50b, whereby the chip region 50a is formed into an individual semiconductor chip (the semiconductor substrate 40), thereby completing the silicon carbide semiconductor device 10 depicted in FIGS. 1 and 2.

As described above, according to the first embodiment, the voltage withstanding structure disposed in the edge termination region constitutes the spatial modulation JTE structure, which is a combination of the JTE structure and the FLR structure. All of the FLRs configuring the FLR structure are surrounded by the innermost one of the p$^{---}$-type regions configuring the JTE structure. The innermost one of the FLRs configuring the FLR structure is disposed at the border between the p$^+$-type extension and the innermost one of the p$^{---}$-type regions configuring the JTE structure, so as to overlap both of these regions. As a result, variation of breakdown voltage characteristics of the spatial modulation JTE structure may be suppressed, whereby a predetermined breakdown voltage may be stably ensured in the edge termination region.

Further, according to the first embodiment, the width and arrangement of the FLR structure configuring the spatial modulation JTE structure are adjusted, whereby the spatial modulation JTE structure may be formed concurrently with any of the regions of the active region and therefore, the number of masks and the number of ion implantation processes, etc. may be reduced, whereby manufacturing lead-time may be shortened. In the conventional structure (refer to FIG. 19), 18 masks are used and therefore, according to the first embodiment, for each mask by which the number of masks is reduced, a time reduction of about 5 percent is possible. Therefore, for example, by forming the FLR structure concurrently with the p$^{++}$-type contact regions of the active region and forming the n$^+$-type channel stopper region concurrently with the n$^+$-type source regions of the active region, the number of masks may be reduced by a total of 2 masks, whereby the manufacturing lead-time may be reduced by about 10 percent.

Further, according to the first embodiment, the voltage withstanding structure disposed in the edge termination region constitutes the spatial modulation JTE structure, which is a combination of the JTE structure and the FLR structure, and therefore, a width (area of the edge termination region) of the edge termination region may be smaller than that of the conventional structure. As a result, chip size may be reduced, thereby enabling cost reductions. Further, according to the first embodiment, a predetermined breakdown voltage is stably ensured in the edge termination region, whereby avalanche breakdown in the edge termination region may be suppressed. As a result, avalanche capability may be determined by the breakdown voltage of the active region and reliability may be enhanced.

Next, a method of manufacturing a silicon carbide semiconductor device according to a second embodiment is described. FIGS. 7, 8, 9, and 10 are cross-sectional views depicting states of the silicon carbide semiconductor device according to the second embodiment during manufacture. In FIGS. 7 to 10, only the outer peripheral portion 1b of the active region 1 and the edge termination region 2 of one of the chip regions 50a (refer to FIG. 2) is depicted, and the center portion 1a of the active region 1 is described with reference to FIG. 2. By the method of manufacturing the silicon carbide semiconductor device according to the second embodiment, the silicon carbide semiconductor device 10 depicted in FIGS. 1 and 2 is fabricated (manufactured). Arrangement of the dicing line 50b and the chip region 50a of the semiconductor wafer 50 is similar to that of the first embodiment.

Figure 7:
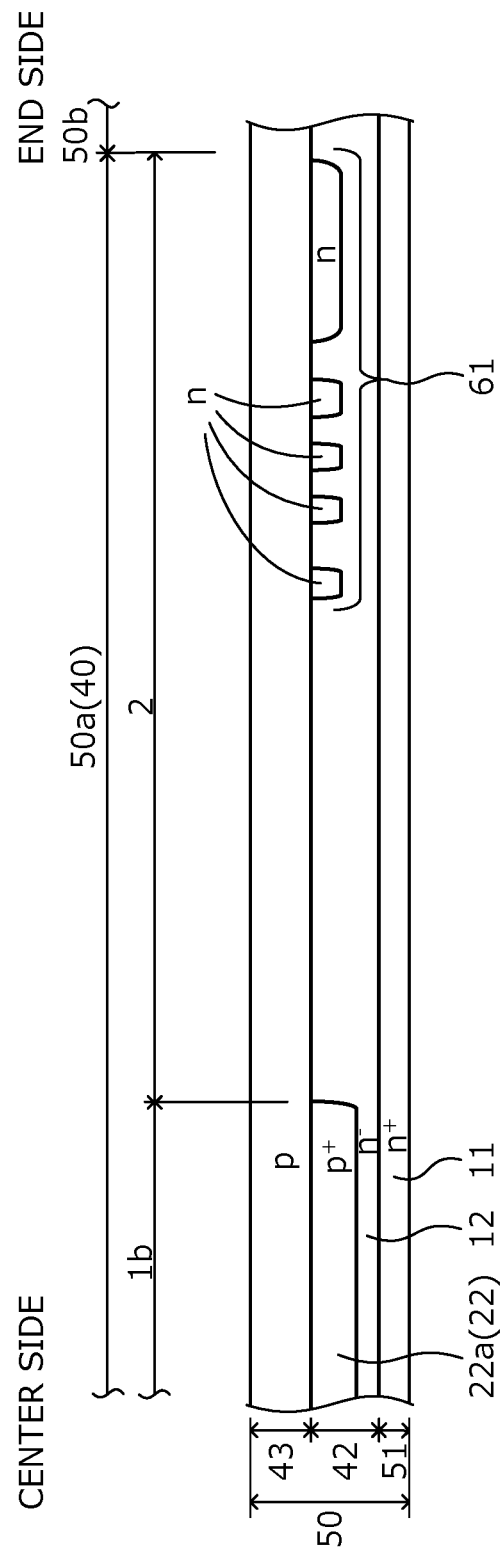
FIG. 7 is a cross-sectional view depicting a state of a silicon carbide semiconductor device according to a second embodiment during manufacture.

In the method of manufacturing the silicon carbide semiconductor device according to the second embodiment, a method of forming the JTE structure (the p$^{---}$-type regions 32) configuring the spatial modulation JTE structure 30 differs from that in the method of manufacturing the silicon carbide semiconductor device 10 according to the first embodiment (refer to FIGS. 3 to 6). In particular, in the second embodiment, first, as depicted in FIG. 7, similarly to the first embodiment, from the epitaxial growth of the n$^-$-type silicon carbide layer 42 on the front surface of the n$^+$-type starting wafer 51, the formation of the first p$^+$-type regions 21 and the lower portions of the second p$^+$-type regions 22, the epitaxial growth for increasing the thickness of the n$^-$-type silicon carbide layer 42, and the formation of the upper portions of the second p$^+$-type regions 22 are sequentially performed.

Next, in the portion 42a that increases the thickness of the n$^-$-type silicon carbide layer 42 in the edge termination region 2, n-type regions (first-conductivity-type low-concentration regions) 61 are formed by photolithography and ion implantation of an n-type impurity in portions excluding formation regions of the p$^{---}$-type regions 32 of the spatial modulation JTE structure 3. In other words, the n-type regions 61 are formed between formation regions of adjacent p$^{---}$-type regions of the p$^{---}$-type regions 32, and in a portion closer to the chip end than is a formation region of the outermost one of the p$^{---}$-type regions 32. An n-type impurity concentration of the n-type regions 61 is substantially equal to the p-type impurity concentration of the p$^{---}$-type regions 32 of the spatial modulation JTE structure 30. The n-type regions 61, for example, may be formed concurrently with the n-type current spreading region (not depicted), etc. of the active region 1.

Figure 8:
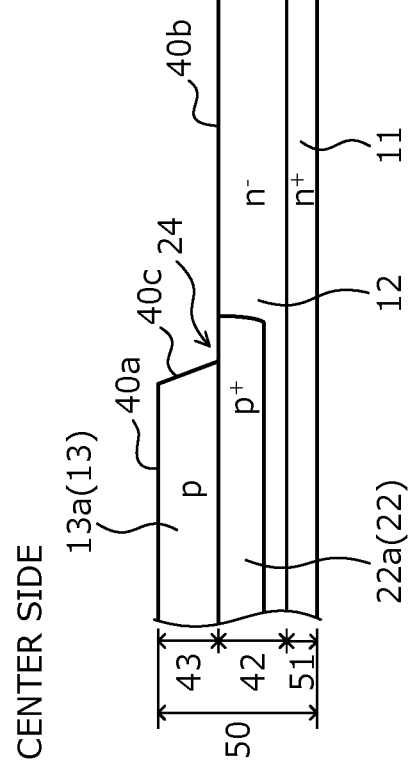
FIG. 8 is a cross-sectional view depicting a state of the silicon carbide semiconductor device according to the second embodiment during manufacture.
Figure 9:
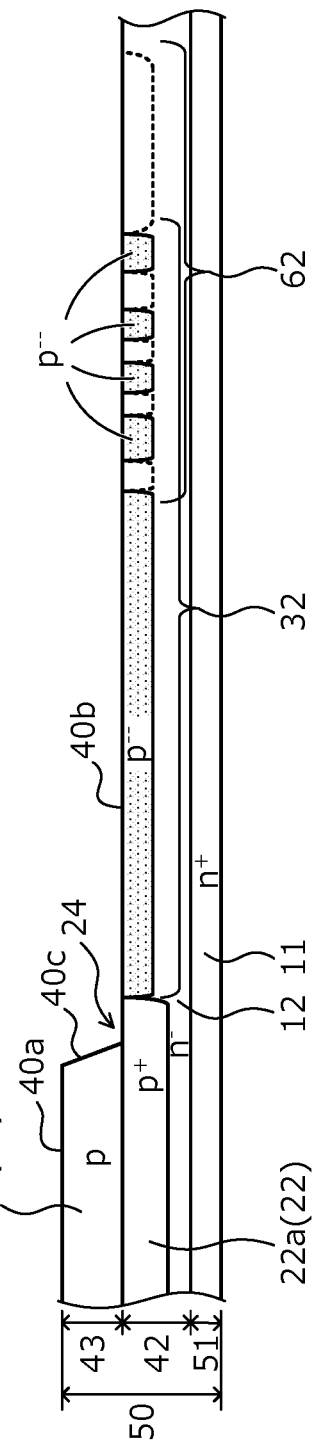
FIG. 9 is a cross-sectional view depicting a state of the silicon carbide semiconductor device according to the second embodiment during manufacture.

Next, as depicted in FIG. 8, similarly to the first embodiment, after the p-type silicon carbide layer 43 is formed on the n$^-$-type silicon carbide layer 42, a portion of the p-type silicon carbide layer 43 in the edge termination region 2 is removed, and the n$^-$-type silicon carbide layer 42 is exposed at the front surface of the semiconductor wafer 50, at the second portion 40b thereof closer to the chip end and lower toward the n$^+$-type starting wafer 51 than is the first portion 40a. Next, as depicted in FIG. 9, in an entire area of a surface region (surface region of the n$^-$-type silicon carbide layer 42) of the semiconductor wafer 50, at the second portion 40b of the front surface thereof, a p-type impurity is ion-implanted, counter-implanting the n-type regions 61 with a p-type and reducing the n-type impurity concentration of the n-type regions 61.

As a result, portions of a surface region of the semiconductor wafer 50, at the second portion 40b of the front surface thereof (surface region of the n$^-$-type silicon carbide layer 42 in the edge termination region 2) excluding the n-type regions 61 are inverted into a p-type, becoming the p$^{---}$-type regions 32 of the spatial modulation JTE structure 30. Between adjacent p$^{---}$-type regions 32 of the p$^{---}$-type regions 32, the n-type regions 61 are counter-implanted with a p-type, whereby n-type regions (first-conductivity-type low-concentration regions) 62 having an n-type impurity concentration lower than that of the n-type regions 61 are disposed. While the impurity concentration of the n-type regions 62 may be preferably substantially equal to the impurity concentration (=about 7.4×10$^{16}$/cm$^3$) of the n$^-$-type drift region 12, the impurity concentration of the n-type regions 62 may be increased to about 10 times the impurity concentration of the n$^-$-type drift region 12.

An ion implantation of a p-type impurity to an entire area of a surface region of the semiconductor wafer 50, at the second portion 40b of the front surface thereof to form the p$^{---}$-type regions 32, for example, may be performed using an etching mask used in the etching to remove the portion of the p-type silicon carbide layer 43 in the edge termination region 2. Alternatively, the ion implantation of a p-type impurity to an entire area of a surface region of the semiconductor wafer 50, at the second portion 40b of the front surface thereof to form the p$^{---}$-type regions 32 may be performed using a channel implantation that is for adjusting the gate threshold voltage by ion-implanting a p-type impurity in a channel portion (n-type inversion layer formed in the p-type base region 13 when the MOSFET is ON) of the active region 1, without using a mask.

Figure 10:
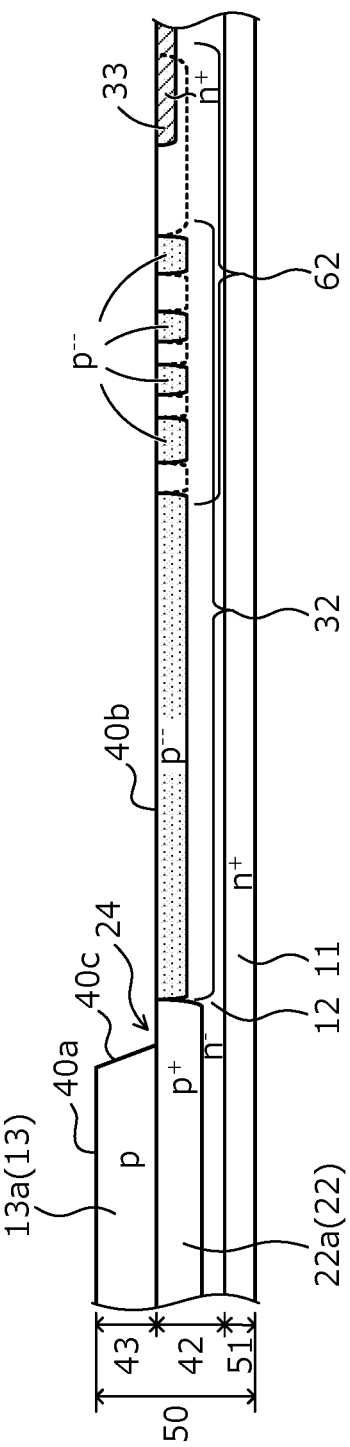
FIG. 10 is a cross-sectional view depicting a state of the silicon carbide semiconductor device according to the second embodiment during manufacture.

Next, as depicted in FIG. 10, similarly to the first embodiment, concurrently with the formation of the n$^+$-type source regions 14, the n$^+$-type channel stopper region 33 is selectively formed. Next, similarly to the first embodiment, concurrently with the formation of the p$^{++}$-type contact regions 15 and the p$^{++}$-type contact extension 15a, the FLRs 31 are formed, whereby the spatial modulation JTE structure 30 similar to that of the first embodiment is formed (refer to FIG. 6). A sequence in which the FLRs 31, the p$^{---}$-type regions 32, the n$^+$-type channel stopper region 33, and the n-type regions 61 are formed may be interchanged. Thereafter, the heat treatment for impurity activation and subsequent processes are sequentially performed, whereby the silicon carbide semiconductor device 10 depicted in FIGS. 1 and 2 is completed.

As described above, according to the second embodiment, effects similar to those of the first embodiment may be obtained. Further, according to the second embodiment, the JTE structure (p⁻⁻⁻-type regions) configuring the spatial modulation JTE structure is formed by using n-type regions that can be formed concurrently with the ion implantation for forming regions of the active region and by reducing the impurity concentration of the n-type regions by ion-implanting a p-type impurity in an entire area of the edge termination region using a mask that is used in another process. Portions of the edge termination region excluding the n-type regions constitute the JTE structure configuring the spatial modulation JTE structure. As a result, the number of masks for forming the spatial modulation JTE structure may be further reduced.

Figure 11:
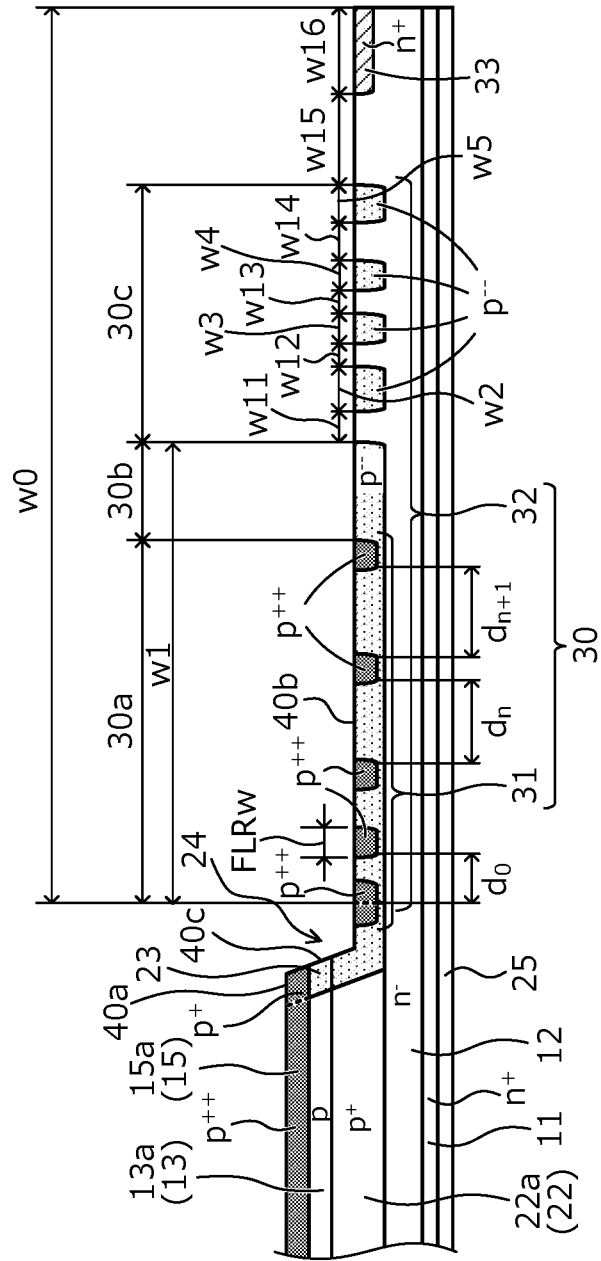
FIG. 11 is a cross-sectional view depicting an example of a spatial modulation JTE structure of an experimental example.
Figure 13:
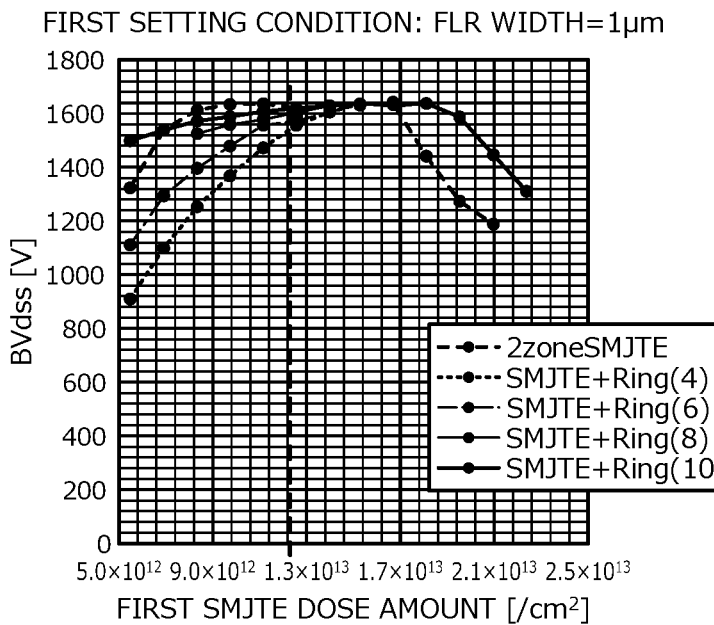
FIG. 13 is a characteristics diagram depicting a relationship between breakdown voltage and dose amount of a JTE structure configuring the spatial modulation JTE structure of the experimental example.
Figure 14:
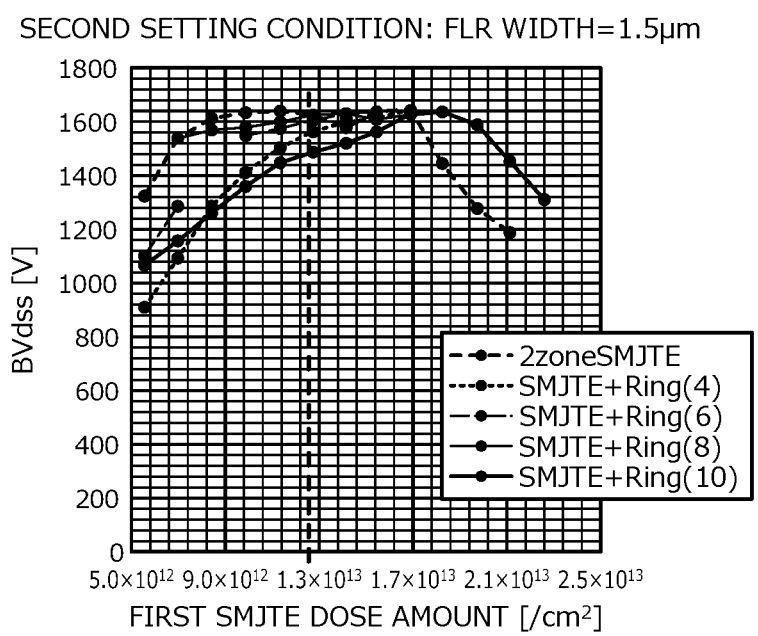
FIG. 14 is a characteristics diagram depicting a relationship between breakdown voltage and dose amount of the JTE structure configuring the spatial modulation JTE structure of the experimental example.
Figure 15:
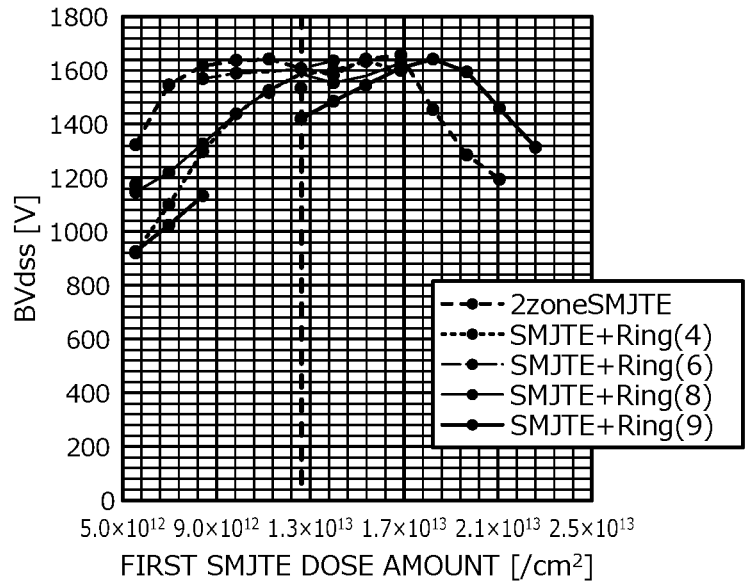
FIG. 15 is a characteristics diagram depicting a relationship between breakdown voltage and dose amount of the JTE structure configuring the spatial modulation JTE structure of the experimental example.
Figure 16:
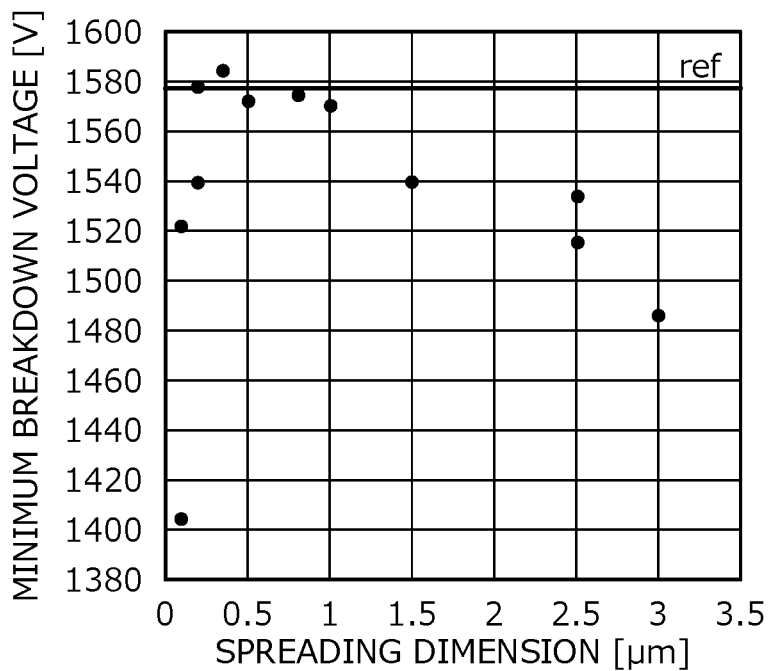
FIG. 16 is a characteristics diagram depicting a relationship between breakdown voltage and spreading dimension of a FLR structure configuring the spatial modulation JTE structure of the experimental example.
Figure 17:
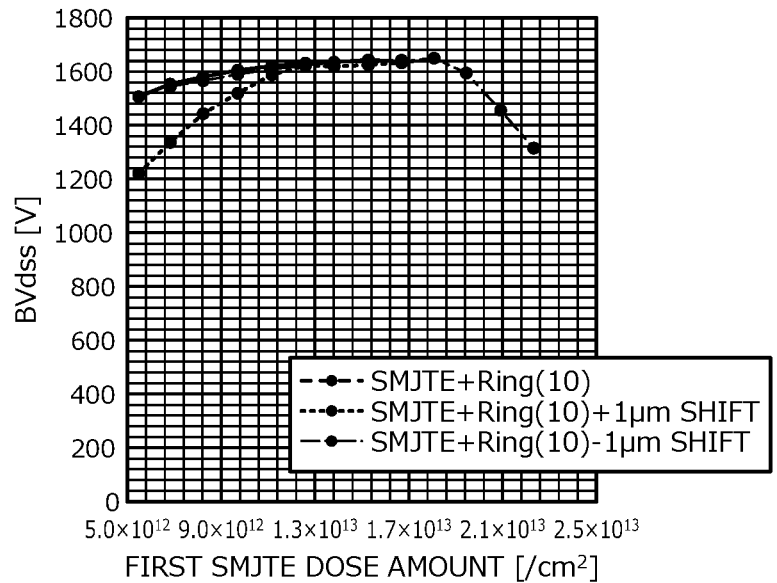
FIG. 17 is a characteristics diagram depicting a relationship between breakdown voltage and arrangement of FLRs configuring the spatial modulation JTE structure of the experimental example.
Figure 18:
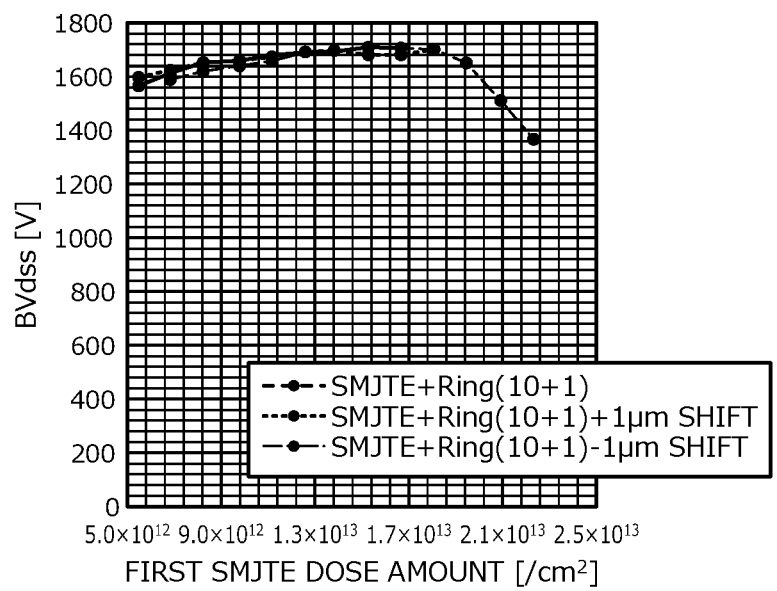
FIG. 18 is a characteristics diagram depicting a relationship between breakdown voltage and arrangement of FLRs configuring a spatial modulation JTE structure of an example.

The breakdown voltage of the edge termination region 2 in which the spatial modulation JTE structure 30 (refer to FIG. 2) is disposed was verified. FIG. 11 is a cross-sectional view depicting an example of a spatial modulation JTE structure of an experimental example. FIG. 12 is a table showing simulation conditions and judgment results for an experimental example. FIGS. 13, 14, and 15 are characteristics diagrams depicting relationships between breakdown voltage and dose amount of the JTE structure configuring the spatial modulation JTE structure of the experimental example. FIG. 16 is a characteristics diagram depicting a relationship between breakdown voltage and the spreading dimension of the FLR structure configuring the spatial modulation JTE structure of the experimental example. FIGS. 17 and 18 are characteristics diagrams depicting a relationship between breakdown voltage and arrangement of FLRs configuring the spatial modulation JTE structure of the experimental example and that of an example, respectively.

Results of simulating the breakdown voltage of the edge termination region 2 under simulation conditions (hereinafter, first, second, and third setting conditions) that include variously changing an arrangement interval, width, and number of the FLRs 31 configuring the spatial modulation JTE structure 30 of the first embodiment described above (refer to FIG. 2) are depicted in FIG. 12. To confirm effects of the arrangement interval, the width (width in the direction of the normal), and the number of the FLRs 31 on the breakdown voltage of the edge termination region 2, the first to the third setting conditions were set including a condition that all of the FLRs 31 are disposed closer to the chip end than is the border between the p⁺-type extension 22a and the innermost one of the p⁻⁻⁻-type regions 32 without providing the FLR 31 that overlaps the p⁺-type extension 22a and the innermost one of the p⁻⁻⁻-type regions 32.

The widths of the FLRs 31 under the first to the third setting conditions were 1 µm, 1.5 µm, and 2 µm, respectively. For the number of the FLRs 31, the first to the third setting conditions each included four different simulation conditions (4 FLRs, 6 FLRs, 8 FLRs, and 10 FLRs; however, for the third setting conditions, 9 FLRs were set because 10 of the FLRs 31 could not be disposed). Simulation conditions for a width (length from the border between the p⁺-type extension 22a and the innermost one of the p⁻⁻⁻-type regions 32 to the end of the semiconductor substrate 40) w0 of the edge termination region 2, the spatial modulation region 30c, and the n⁺-type channel stopper region 33 were the same in the first to the third setting conditions. In particular, the simulation conditions were as follows. The width w0 of the edge termination region 2 was 150 µm.

The spatial modulation JTE structure having the spatial modulation region 30c is configured by five of the p⁻⁻⁻-type regions 32. Widths (width in the direction of the normal) w1, w2, w3, w4, w5 of the five p⁻⁻⁻-type regions 32, sequentially from the innermost one thereof, were 40 µm, 4.6 µm, 1.6 µm, 2.2 µm, and 2.5 µm. The width of the spatial modulation region 30c was fixed (=30 µm), and respective intervals w11, w12, w13, w14 between adjacent p⁻⁻⁻-type regions of the p⁻⁻⁻-type regions 32, sequentially from the innermost one thereof, were 1.5 µm, 1.8 µm, 1.8 µm, and 4 µm. An interval w15 between the outermost one of the p⁻⁻⁻-type regions 32 and the n⁺-type channel stopper region 33 was 20 µm. A width w16 of the n⁺-type channel stopper region 33 was 20 µm.

The width w1 of the innermost one of the p⁻⁻⁻-type regions 32 was fixed (=40 µm) and for each simulation condition, an interval do between the p⁺-type extension 22a and the innermost one of the FLRs 31, and the spreading dimension of the FLR structure (=$d_{n+1}-d_n$, where, n is a positive number (n≥1) and a maximum value of n=the number of the FLRs 31-1) were set according to the number of the FLRs 31 so that the width of the JTE region 30b was about 10 µm. FIG. 11 depicts a cross-sectional view of the structure in an instance in which the number of the FLRs 31 was four. For each of the first to the third setting conditions, four simulation conditions are shown in FIG. 12. In FIG. 12, "structure name" is a name to identify simulation conditions.

In FIG. 12, a "structure name" of "SMJTE" means to have a spatial modulation JTE structure having the spatial modulation region 30c formed by the p⁻⁻⁻-type regions 32. A "structure name" of "Ring(m), where m is a positive number (m≥1)" means the number of the FLRs 31 disposed in the innermost one of the p⁻⁻⁻-type regions 32 is m FLRs. Accordingly, an instance of a "structure name" of, for example, "SMJTE+Ring(4))" means a spatial modulation JTE structure having the spatial modulation region 30c formed by the p⁻⁻⁻-type regions 32 is provided having a structure in which four of the FLRs 31 are disposed in the innermost one of the p⁻⁻⁻-type regions 32.

"Minimum breakdown voltage" is a minimum breakdown voltage of the edge termination region 2 and is the minimum breakdown voltage thereof that may be obtained within a ±20% range of the target dose amount of the p⁻⁻⁻-type regions 32. Based on the minimum breakdown voltage of the edge termination region 2, whether a predetermined breakdown voltage of the edge termination region 2 is obtained is indicated by "judgment". Judgment "○" is an instance in which "minimum breakdown voltage" is at least 1550V having a difference within, for example, 5% of a breakdown voltage of about 1600V for the edge termination region 102 of a conventional example. Judgment "Δ" is an instance in which "minimum breakdown voltage" is at least the predetermined breakdown voltage 1500V (maximum applied voltage 80%, safety margin 20%) that includes a safety margin of the edge termination region 2. Judgment "x" is an instance in which "minimum breakdown voltage" is less than 1500V.

Results of simulating the breakdown voltage of the edge termination region 2 with respect to the dose amount of the p⁻⁻⁻-type regions 32 under the first to the third setting conditions for the experimental example are shown in FIGS. 13 to 15, respectively. The first to the third setting conditions each includes four simulation conditions (the first to the third setting conditions: SMJTE+Ring(4), SMJTE+Ring(6) and SMJTE+Ring(8), the first and the second setting conditions: SMJTE+Ring(10), the third setting conditions: SMJTE+Ring(9)) under which simulation was performed. In FIGS. 13 to 15, a horizontal axis indicates dose amount (first SMJTE dose amount) of the innermost one of the p⁻⁻⁻-type regions 32 and a vertical axis indicates breakdown voltage BVdss of the edge termination region 2.

In FIGS. 13 to 15, simulation results for the conventional silicon carbide semiconductor device 110 (hereinafter, the conventional example, refer to FIG. 19) having the double-zone spatial modulation JTE structure 130 (2zoneSMJTE) are further shown. For the conventional example, conditions (the number of and impurity concentration) for the p⁻⁻⁻-type regions 132 were the same as the conditions for the p⁻⁻⁻-type regions 32 of the experimental example, and the p⁻-type regions 131 disposed in the innermost one of the p⁻⁻⁻-type regions 132 and configuring an innermost one of the spatial modulation region 130b were disposed under the most optimal conditions. In the conventional example, the horizontal axis in FIGS. 13 to 15 indicates the dose amount of the innermost one of the p⁻⁻⁻-type regions 132 while the vertical axis indicates the breakdown voltage BVdss of the edge termination region 2.

In FIGS. 13 to 15, vertical dashed lines indicate reference (target) dose amounts (about $1.2 \times 10^{13}/cm^2$) for a p-type region (the p⁻⁻⁻-type region 32 of the experimental example, the p⁻⁻⁻-type region 132 of the conventional example) having a lower impurity concentration of two p-type regions that have different impurity concentrations and configure the innermost one of the spatial modulation regions of the spatial modulation JTE structure. In FIGS. 13 to 15, the horizontal axis indicates variation of the target dose amounts of the innermost one of the p⁻⁻⁻-type regions 32, 132 of the experimental example. As described above, variation of the target of the dose amounts for the p⁻⁻⁻-type regions 32, 132 is variation of the ion implantation amount or variation of the activation rate of the ion-implanted impurity or both.

From the results depicted in FIGS. 13 and 14, in the example, it was confirmed that a predetermined breakdown voltage of the edge termination region 2 may be stably ensured the greater is the number of the FLRs 31. For example, by setting the number of the FLRs 31 to be at least 8, the breakdown voltage may be about the same as that of the edge termination region 102 of the conventional example. On the other hand, from the results depicted in FIG. 15, it was confirmed that when the width of the FLRs 31 is wide, due to an effect of the spreading dimension of the FLR structure ($=d_{n+1}-d_n$) becoming narrower, the predetermined breakdown voltage of the edge termination region 2 is not obtained when the number of the FLRs 31 is increased and the predetermined breakdown voltage of the edge termination region 2 can be more stably ensured by a fewer number of the FLRs 31.

Results of simulation of the breakdown voltage of the edge termination region 2 with respect to the spreading dimension of the FLR structure of the experimental example are shown in FIG. 16. In FIG. 16, a horizontal axis indicates the spreading dimension of the FLR structure ($=d_{n+1}-d_n$) in FIG. 12 and a vertical axis indicates the minimum breakdown voltage in FIG. 12. In FIG. 16, a horizontal line ref indicates the breakdown voltage of the edge termination region 102 of the conventional example. From the results depicted in FIGS. 12 and 16, it was confirmed that when the spreading dimension of the FLR structure is in a range from about 0.1 μm to 2.5 μm (judgment "Δ" and "○"), the breakdown voltage of the edge termination region 2 may be at least 1500V and when the spreading dimension of the FLR structure, for example, is in a range from 0.2 μm to 1.0 μm (judgment "○"), the breakdown voltage of the edge termination region 2 may be at least 1550V.

While not depicted, it was confirmed by the inventor that during high-temperature (at least 150 degrees C.) operation of the experimental example, in the edge termination region 2, when positive charge accumulates at an interface between the passivation film (polyimide protective film) covering the front surface of the semiconductor substrate 40 and the oxide film therebelow (single layer of the interlayer insulating film 19 or stacked film including the field oxide film and the interlayer insulating film 19), the target dose amount of the p⁻⁻⁻-type regions 32 (vertical dashed line in FIGS. 13 to 15) shifts to indicate a higher dose amount (shifts further on the left side in FIGS. 13 to 15) and the breakdown voltage of the edge termination region 2 decreases. No adverse effects of negative charge accumulating at the interface of the passivation film and the oxide film occurred.

Results of simulation of the breakdown voltage BVdss of the edge termination region 2 with respect to arrangement of the FLR structure (number of the FLRs 31) are shown in FIGS. 17 and 18. FIG. 17 shows simulation results for the first setting conditions "SMJTE+Ring(10)" of the experimental example. In FIG. 17, the first setting conditions "SMJTE+Ring(10)" of the experimental example and conditions of shifting the overall arrangement of the FLR structure of the experimental example outward and inward by 1 μm (respectively, "SMJTE+Ring(10)+1 μm shift" and "SMJTE+Ring(10)−1 μm shift") are shown.

FIG. 18 shows simulation results for the example. The example, under the first setting conditions "SMJTE+Ring(10)" of the experimental example, further includes the FLR 31 disposed overlapping the p⁺-type extension 22a and the innermost one of the p⁻⁻⁻-type regions 32 (in FIG. 18, SMJTE+Ring(10+1)). In FIG. 18, "SMJTE+Ring(10+1)" and conditions of shifting the overall arrangement of the FLR structure of the example outward and inward by 1 μm (respectively, "SMJTE+Ring(10+1)+1 μm shift" and "SMJTE+Ring(10+1)−1 μm shift") are shown.

From the results shown in FIG. 17, it was confirmed that in the experimental example, when the FLR structure is disposed at a position shifted outward by 1 μm, the breakdown voltage of the edge termination region 2 decreases. On the other hand, from the results shown in FIG. 18, it was confirmed that in the example, even when the FLR structure is disposed at a position shifted outward by 1 μm, the breakdown voltage of the edge termination region 2 does not decrease. It is surmised that a reason for this is that in the example, even when the FLR structure is disposed shifted outward by about 1 μm, the FLR 31 overlapping the p⁺-type extension 22a and the innermost one of the p⁻⁻⁻-type regions 32 can be disposed, whereby it is possible to suppress variation of the breakdown voltage characteristics of the spatial modulation JTE structure.

A reason for setting the shift amount of the FLR structure as 1 μm is that misalignment during alignment of an ion implantation mask for forming the FLRs 31 is at most about 0.2 μm and a maximum misalignment of 1 μm including variation of the dimensions of the openings of the ion implantation mask was assumed. While not depicted, it was confirmed that even in an instance in which positive charge accumulates at the interface between the passivation film and the oxide film, similarly to the simulation results in FIG. 18, due to the disposal of the FLR 31 overlapping the p⁺-type extension 22a and the innermost one of the p⁻⁻⁻-type regions 32, the breakdown voltage characteristics of the edge termination region 2 do not vary.

In the foregoing, the present invention is not limited to the embodiments described above and various modifications within a range not departing from the spirit of the invention are possible. Further, the present invention is similarly implemented when the conductivity types (n-type, p-type) are reversed.

According to the invention described above, variation of breakdown voltage characteristics of the spatial modulation JTE structure that is disposed in the edge termination region and configured by a combination of the JTE structure and the FLR structure may be suppressed. Further, by adjusting the width and arrangement of the FLR structure configuring the spatial modulation JTE structure, the spatial modulation JTE structure may be formed concurrently with any of the regions of the active region and therefore, the number of masks and the number of processes of ion implantation for forming the spatial modulation JTE structure may be reduced, thereby enabling shortening of the manufacturing lead-time.

The silicon carbide semiconductor device and the method of manufacturing a silicon carbide semiconductor device according to the invention achieve an effect in that a silicon carbide semiconductor device having a voltage withstanding structure formed by fewer processes and capable of stably ensuring a predetermined breakdown voltage may be provided.

As described above, the silicon carbide semiconductor device and the method of manufacturing a silicon carbide semiconductor device according to the present invention are useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide and having an active region and a termination region surrounding a periphery of the active region, the semiconductor substrate having a first main surface and a second main surface opposite to each other, the active region including a center portion and an outer peripheral portion surrounding a periphery of the center portion;
a first-conductivity-type region provided in the semiconductor substrate, spanning both the active region and the termination region;
a second-conductivity-type region provided in the active region, between the first main surface of the semiconductor substrate and the first-conductivity-type region;
a semiconductor device element provided in the center portion of the active region and having a pn junction formed by the first-conductivity-type region and the second-conductivity-type region;
a second-conductivity-type outer peripheral region provided in the outer peripheral portion of the active region and surrounding a periphery of the center portion of the active region;
a first electrode of the semiconductor device element, provided on the first main surface of the semiconductor substrate, electrically connected to both the second-conductivity-type region and the second-conductivity-type outer peripheral region;
a second electrode of the semiconductor device element, provided on the second main surface of the semiconductor substrate, electrically connected to the first-conductivity-type region;
a plurality of field limiting rings (FLRs) of a second conductivity type, concentrically surrounding the periphery of the active region, and being selectively provided separate from one another, between the first main surface of the semiconductor substrate and the first-conductivity-type region, so that the FLRs configure a FLR structure in the termination region; and
a plurality of second-conductivity-type low-concentration regions, concentrically surrounding the periphery of the active region, and being selectively provided separate from one another, between the first main surface of the semiconductor substrate and the first-conductivity-type region, so that the second-conductivity-type low-concentration regions configure a junction termination extension (JTE) structure in the termination region, the second-conductivity-type low-concentration regions having an impurity concentration lower than an impurity concentration of the FLRs, wherein
of the plurality of the second-conductivity-type low-concentration regions, an innermost one that is located closest to the center portion is disposed adjacent to the second-conductivity-type outer peripheral region so as to be closer to an end of the semiconductor substrate than is the second-conductivity-type outer peripheral region, the innermost one extending closer to a periphery of the semiconductor substrate from a border between the first second-conductivity-type low-concentration region and the second-conductivity-type outer peripheral region than do the FLRs,
of the plurality of the second-conductivity-type low-concentration regions, the rest of regions other than the innermost one is disposed closer to the periphery of the semiconductor substrate than are the FLRs, and
of the FLRs, a first FLR that is closest to the center portion is disposed overlapping both the second-conductivity-type outer peripheral region and the first second-conductivity-type low-concentration region.

2. The silicon carbide semiconductor device according to claim 1, wherein a depth of the FLRs is less than a depth of the second-conductivity-type low-concentration regions.

3. The silicon carbide semiconductor device according to claim 1, wherein the impurity concentration of the FLRs is higher than an impurity concentration of the second-conductivity-type outer peripheral region.

4. The silicon carbide semiconductor device according to claim 1, wherein the impurity concentration of the FLRs is in a range from $1 \times 10^{18}/cm^3$ to $1 \times 10^{21}/cm^3$.

5. The silicon carbide semiconductor device according to claim 1, wherein a dose amount of the second-conductivity-type low-concentration regions is in a range from $5.5 \times 10^{12}/cm^2$ to $2.1 \times 10^{13}/cm^2$.

6. The silicon carbide semiconductor device according to claim 1, wherein
the farther an adjacent two of the FLRs are from the active region, the wider is an interval between the adjacent two of the FLRs, and
a spreading dimension of the interval between the adjacent two of the FLRs is in a range from 0.2 μm to 1.0 μm.

7. The silicon carbide semiconductor device according to claim 6, wherein the spreading dimension is in a range from 0.2 μm to 1.0 μm.

8. The silicon carbide semiconductor device according to claim 1, wherein the semiconductor device element includes:
- a first semiconductor region of a first conductivity type, selectively provided between the first main surface of the semiconductor substrate and the second-conductivity-type region,
- a second semiconductor region of the second conductivity type, selectively provided between the first main surface of the semiconductor substrate and the second-conductivity-type region and having an impurity concentration higher than an impurity concentration of the second-conductivity-type region,
- a gate insulating film provided in contact with a region of the second-conductivity-type region between the first semiconductor region and the first-conductivity-type region, and
- a gate electrode provided facing the second-conductivity-type region with the gate insulating film intervening between the gate electrode and the second-conductivity-type region,
- the first electrode is electrically connected to the second-conductivity-type region via the first semiconductor region and the second semiconductor region, and
- the impurity concentration of the FLRs is same as an impurity concentration of the second semiconductor region.

9. A method of manufacturing a silicon carbide semiconductor device including a semiconductor substrate containing silicon carbide and having an active region in which a semiconductor device element having a pn junction formed by a first-conductivity-type region and a second-conductivity-type region is provided in a center portion of the active region, and a termination region surrounding a periphery of the active region, the method comprising:
- forming a first-conductivity-type semiconductor layer on a starting substrate containing silicon carbide, the first-conductivity-type semiconductor layer constituting the first-conductivity-type region;
- forming a second-conductivity-type semiconductor layer on the first-conductivity-type semiconductor layer in the active region, the second-conductivity-type semiconductor layer constituting the second-conductivity-type region;
- selectively forming a first semiconductor region of a first conductivity type in the second-conductivity-type semiconductor layer, at a surface of the second-conductivity-type semiconductor layer;
- selectively forming a second semiconductor region of a second conductivity type in the second-conductivity-type semiconductor layer, at a surface of the second-conductivity-type semiconductor layer;
- forming a second-conductivity-type outer peripheral region in an outer peripheral portion of the active region, so as to surround a periphery of the center portion of the active region;
- selectively forming a plurality of field limiting rings (FLRs) of a second conductivity type in the first-conductivity-type semiconductor layer, at a surface of the first-conductivity-type semiconductor layer in the termination region, the FLRs being disposed separate from one another, and concentrically surrounding the periphery of the active region, so that the FLRs configure a FLR structure;
- selectively forming a plurality of second-conductivity-type low-concentration regions in a surface layer of the first-conductivity-type semiconductor layer in the termination region, the second-conductivity-type low-concentration regions being disposed separate from one another, and concentrically surrounding the periphery of the active region, so that the second-conductivity-type low-concentration regions configure a junction termination extension (JTE) structure, the second-conductivity-type low-concentration regions having an impurity concentration lower than an impurity concentration of the FLRs;
- forming a first electrode of the semiconductor device element, on a first main surface of the semiconductor substrate, the first electrode being electrically connected to the second-conductivity-type region and the second-conductivity-type outer peripheral region; and
- forming a second electrode of the semiconductor device element, on a second main surface of the semiconductor substrate, the second electrode being electrically connected to first-conductivity-type region, wherein
- of the plurality of the second-conductivity-type low-concentration regions, an innermost one that is located closest to the center portion is disposed adjacent to the second-conductivity-type outer peripheral region so as to be closer to an end of the semiconductor substrate than is the second-conductivity-type outer peripheral region, the innermost one extending closer to a periphery of the semiconductor substrate from a border between the first second-conductivity-type low-concentration region and the second-conductivity-type outer peripheral region than do the FLRs,
- of the plurality of the second-conductivity-type low-concentration regions, the rest of regions other than the innermost one is disposed closer to the periphery of the semiconductor substrate than are the FLRs,
- of the FLRs, a first FLR that is closest to the center portion is disposed overlapping both the second-conductivity-type outer peripheral region and the first second-conductivity-type low-concentration region, and
- the second semiconductor region and the FLRs are formed concurrently.

10. A method of manufacturing a silicon carbide semiconductor device including a semiconductor substrate containing silicon carbide and having an active region in which a semiconductor device element having a pn junction formed by a first-conductivity-type region and a second-conductivity-type region is provided in a center portion of the active region, and a termination region surrounding a periphery of the active region, the method comprising:
- forming a first-conductivity-type semiconductor layer on a starting substrate containing silicon carbide, the first-conductivity-type semiconductor layer constituting the first-conductivity-type region;
- forming a second-conductivity-type semiconductor layer on the first-conductivity-type semiconductor layer in the active region, the second-conductivity-type semiconductor layer constituting the second-conductivity-type region;
- selectively forming a first semiconductor region of a first conductivity type in the second-conductivity-type semiconductor layer, at a surface of the second-conductivity-type semiconductor layer;
- selectively forming a second semiconductor region of a second conductivity type in the second-conductivity-type semiconductor layer, at a surface of the second-conductivity-type semiconductor layer;
- forming a second-conductivity-type outer peripheral region in an outer peripheral portion of the active region, so as to surround a periphery of the center portion of the active region;

selectively forming a plurality of field limiting rings (FLRs) of a second conductivity type in the first-conductivity-type semiconductor layer, at a surface of the first-conductivity-type semiconductor layer in the termination region, the FLRs being disposed separate from one another, and concentrically surrounding the periphery of the active region, so that the FLRs configure a FLR structure;

selectively forming a plurality of second-conductivity-type low-concentration regions in the first-conductivity-type semiconductor layer, at the surface of the first-conductivity-type semiconductor layer in the termination region, the second-conductivity-type low-concentration regions being disposed separate from one another, and concentrically surrounding the periphery of the active region, so that the second-conductivity-type low-concentration regions configure a junction termination extension (JTE) structure, the second-conductivity-type low-concentration regions having an impurity concentration lower than an impurity concentration of the FLRs;

forming a gate insulating film in contact with a region of the second-conductivity-type region between the first semiconductor region and the first-conductivity-type region;

forming a gate electrode facing the second-conductivity-type region with the gate insulating film intervening between the gate electrode and the second-conductivity-type region;

adjusting a gate threshold voltage by introducing an impurity of the second conductivity type in the region of the second-conductivity-type region between the first semiconductor region and the first-conductivity-type region;

forming a first electrode of the semiconductor device element, on a first main surface of the semiconductor substrate, the first electrode being electrically connected to the second-conductivity-type region and the second-conductivity-type outer peripheral region; and forming a second electrode of the semiconductor device element, on a second main surface of the semiconductor substrate, the second electrode being electrically connected to first-conductivity-type region, wherein forming the second-conductivity-type low-concentration regions includes:

selectively forming a plurality of first-conductivity-type low-concentration regions in the first-conductivity-type semiconductor layer, at the surface of the first-conductivity-type semiconductor layer in the termination region, the first-conductivity-type low-concentration regions having an impurity concentration of the first conductivity type of a same magnitude as the impurity concentration of the second conductivity type of the second-conductivity-type low-concentration regions, and introducing the impurity of the second conductivity type in an entire area of a surface region of the first-conductivity-type semiconductor layer in the termination region, thereby forming the second-conductivity-type low-concentration regions in portions other than the first-conductivity-type low-concentration regions and reducing the impurity concentration of the first-conductivity-type low-concentration regions, of the plurality of the second-conductivity-type low-concentration regions, an innermost one that is located closest to the center portion is disposed adjacent to the second-conductivity-type outer peripheral region so as to be closer to an end of the semiconductor substrate than is the second-conductivity-type outer peripheral region, the innermost one extending closer to a periphery of the semiconductor substrate from a border between the first second-conductivity-type low-concentration region and the second-conductivity-type outer peripheral region than do the FLRs, of the plurality of the second-conductivity-type low-concentration regions, the rest of regions other than the innermost one is disposed closer to the periphery of the semiconductor substrate than are the FLRs, of the FLRs, a first FLR that is closest to the center portion is disposed overlapping both the second-conductivity-type outer peripheral region and the first second-conductivity-type low-concentration region, and adjusting the gate threshold voltage by introducing the impurity of the second conductivity type in the region of the second-conductivity-type region is performed concurrently with forming the second-conductivity-type low-concentration regions and reducing the impurity concentration of the first-conductivity-type low-concentration regions by introducing the impurity of the second conductivity type in the entire area of the surface region of the first-conductivity-type semiconductor layer in the termination region.

* * * * *